United States Patent [19]
Cordoba et al.

[11] Patent Number: 5,337,284
[45] Date of Patent: Aug. 9, 1994

[54] HIGH VOLTAGE GENERATOR HAVING A SELF-TIMED CLOCK CIRCUIT AND CHARGE PUMP, AND A METHOD THEREFOR

[75] Inventors: Michael V. Cordoba; Kim C. Hardee, both of Colorado Springs, Colo.

[73] Assignees: United Memories, Inc., Colorado Springs, Colo.; Nippon Steel Semiconductor Corp., Chiba, Japan

[21] Appl. No.: 3,028

[22] Filed: Jan. 11, 1993

[51] Int. Cl.$^5$ .............................................. G11C 7/00
[52] U.S. Cl. ................................. 365/227; 307/296.4; 365/189.09
[58] Field of Search ............... 365/226, 189.09, 227; 307/296.2, 296.4

[56] References Cited

U.S. PATENT DOCUMENTS

| | | | |
|---|---|---|---|
| 4,142,114 | 2/1979 | Green et al. | 307/296.2 |
| 4,356,412 | 10/1982 | Moench et al. | 307/304 |
| 4,401,897 | 8/1983 | Martino, Jr. et al. | 307/297 |
| 4,553,047 | 11/1985 | Dillinger et al. | 307/304 |
| 4,581,546 | 4/1986 | Allan | 307/297 |
| 4,585,954 | 4/1986 | Hashimoto et al. | 307/296.2 |
| 4,739,191 | 4/1988 | Puar | 307/297 |
| 4,883,976 | 11/1989 | Deane | 307/296.2 |
| 4,935,644 | 6/1990 | Tsujimoto | 307/304 |
| 5,126,590 | 6/1992 | Chern | 307/296.2 |
| 5,153,855 | 10/1992 | Konishi | 365/226 X |
| 5,191,235 | 3/1993 | Hara | 307/296.2 |
| 5,220,534 | 6/1993 | Redwine et al. | 365/226 |

FOREIGN PATENT DOCUMENTS 0030244 6/1981 European Pat. Off. .
0498107 8/1992 European Pat. Off. .

OTHER PUBLICATIONS

Martino, Jr., et al., *An On-Chip Back-Bias Generator for MOS Dynamic Memory,* IEEE Journal of Solid-State Circuits, Oct. 1980, at 620–625.
Gillingham et al., "High-Speed, High-Reliability Circuit Design for Megabit DRAM" IEEE Journal of Solid-State Circuits, vol. 26, No. 8, Aug. 1991.
R. C. Foss et al. "Application of High Voltage Pumped Supply for Low-Power DRAM." Symposium on VLSI Circuits, Digest of Technical Papers, (1992).

*Primary Examiner*—Eugene R. LaRoche
*Assistant Examiner*—Christopher R. Glembocki
*Attorney, Agent, or Firm*—Edward D. Manzo; John J. King

[57] ABSTRACT

A voltage generator for low power applications includes a circuit for generating, controlling and maintaining a high voltage for low power applications in an integrated circuit. The circuit includes separate standby and active circuits for pumping $V_{CCP}$ of a DRAM under different circumstances. The standby and active circuits operate independently of one another, but may operate simultaneously, to pump charge to $V_{CCP}$. The standby circuit is generally a low power circuit activated in response to power up and leakage current conditions to maintain $V_{CCP}$. The active circuit is generally a larger circuit and can pump more current. The active circuit is generally responsive to the word lines being driven. Accordingly, the voltage generator can maintain $V_{CCP}$ while minimizing power consumption in DRAM.

45 Claims, 12 Drawing Sheets

HIGH VOLTAGE GENERATOR HAVING A SELF-TIMED CLOCK CIRCUIT AND CHARGE PUMP, AND A METHOD THEREFOR

FIELD OF THE INVENTION

This invention relates to a voltage generator for low-power applications in integrated circuitry. It relates more particularly to a circuit for generating, controlling, and maintaining a high voltage, of the same polarity as the power source to the integrate circuit, for low-power applications in the integrated circuit.

DESCRIPTION OF THE PRIOR ART

Previously, a high voltage for an integrated circuit has been generated by free running oscillators and DC regulators driving a pump. However, these circuits can often draw considerable power. For low-power applications, it is desirable to reduce current and power in the circuit. One method to reduce the power is to use a low-frequency oscillator and to break the DC path in the voltage regulator circuit. However, power is still consumed in the oscillator and regulator circuit when they are turned on.

Pumped circuits have been used to provide a voltage to an integrated circuit substrate, where the substrate is pumped to a voltage opposite in polarity to the power supply voltage VCC. However, pumped circuits have not been particularly useful to generate high voltages of the same polarity as VCC, which high voltage may be used to drive word lines and other circuits. One main problem has been the power dissipation, described in the preceding paragraph. The art has often used bootstrapped circuits to provide high voltages.

An object of the present invention is to use pumped circuits which minimize power consumption for maintaining a high voltage called $V_{CCP}$ of a DRAM or other memory device by using separate standby and active circuitry.

Another object of the present invention is to provide a circuit having a low current standby circuit which continuously maintains $V_{CCP}$ of a DRAM and an active circuit which is activated whenever $V_{CCP}$ drops below a desired value and a word line of a DRAM is accessed.

Another object of the present invention is to provide a low current standby circuit which continuously maintains $V_{CCP}$ of a DRAM and an active circuit which is activated whenever a word line of a DRAM is accessed.

By using pumped circuits, the circuit allows a quicker response than would generally be available with bootstrapped circuits.

SUMMARY OF THE INVENTION

The present invention relates to a high-voltage regulator (or voltage-up converter) circuit for low-power applications in an integrated circuit. Specifically, the circuit uses charge pumps to provide a voltage $V_{CCP}$, which has the same polarity as the power supply to the integrated circuit. Such voltage is useful, for example, when driving the access word lines in a DRAM (Dynamic Random Access Memory) or other memory devices. When the word lines of a DRAM cell are accessed, $V_{CCP}$ tends to drop. Therefore, it is necessary to maintain $V_{CCP}$ by pumping charge to a node. However, the present invention could find application in any circuit requiring a low power voltage generator for maintaining a high voltage at a particular node.

A high voltage generator according to the present invention does not rely wholly on a free-running oscillator. Preferably, no free-running oscillator is used. In the invented apparatus, at least one charge pump is used in combination with at least one self-timed clock circuit. A demand signal such as a clock enable signal corresponding to high voltage use (such as a row address strobe type of signal) or a pump signal from a voltage regulator preferably sets a latch in a self-timed clock circuit. Setting the latch initiates the generation of a first group of clock signals that are used by the charge pump for pumping charge to a capacitive node which is insulated from the substrate of the integrated circuit. Preferably at the end of the first group of clock signals, the latch is reset but concomitantly an input circuit to the latch is disabled from recognizing a new pump signal. Preferably the resetting of the latch causes the clock circuit to generate a second group of clock signals used in the charge pump to prepare fully for the next demand for pumping. Preferably at the end of the second group of clock signals, a full cycle of clock signals has been completed in a self-timed manner, and the input circuit to the latch is reenabled to recognize a subsequent demand signal. Thus, a self-timed interval having first and second consecutive portions is provided by the clock circuit once it has been initiated or activated.

According to method aspects of the present invention, a high voltage is generated having the same polarity as a power supply voltage for an integrated circuit, for use by circuits formed on or above a substrate of the integrated circuit. One feature of the method included is, in response to a demand signal, initiating the generation of a full cycle of clock signals over a predetermined interval, the full cycle including a plurality of first clock signals followed by a plurality of second clock signals. The full cycle is generated despite any termination in the demand signal. The method uses the first clock signals to cause a charge pump to pump charge having the same polarity as the power supply voltage to a capacitive node insulated from the substrate. The method uses the second clock signals to precharge the charge pump.

In the preferred embodiment, the method uses a self-timed clock circuit to produce the first and second clock pulses in a self-timed interval. Preferably this occurs by setting a logic circuit in the self-timed clock circuit, such as latch, to a first state. The setting of the latch initiates the generation of the first clock signals during a first portion of the self-timed interval. A signal is used in the preferred embodiment to disable an input to the latch so that a PUMP signal or other demand signal to the self-timed clock circuit will be ineffective until the second clock pulses have also been generated. Thus, at substantially the end of the first portion of the self-timed interval, an input to the latch is disabled, and the latch is reset. Preferably the resetting of the latch initiates the generation of the second clock pulses during a second portion of the self-timed interval. A signal at substantially the end of the second portion reenables the latch input so that a continued PUMP or other demand signal, or a new such signal, will initiate the generation of another full set of clock pulses.

The present invention combines separate standby and active pump circuits for maintaining $V_{CCP}$ under different circumstances. Each of these circuits operates independently of the other, but may operate simultaneously, to pump charge to maintain $V_{CCP}$. The standby circuit is used to respond to power up and leakage current to maintain $V_{CCP}$. To minimize power consumption, the current in the standby circuit is maintained as low as possible. Specifically, the standby circuit includes a low power standby voltage regulator circuit and low power standby pump which are sufficient to respond to a decreased $V_{CCP}$ due to a power-up condition or leakage current. The standby regulator monitors $V_{CCP}$ and enables a standby clock when $V_{CCP}$ drops below a desired value. The standby clock generates clock signals to operate the standby pump for pumping charge to restore $V_{CCP}$. The standby clock is a self-timed clock and, therefore, eliminates the need for a constantly running oscillator. Preferably, the standby clock and standby pump are off when $V_{CCP}$ is at the desired voltage in order to reduce power consumption. Preferably the standby voltage regulator circuit is continuously operating and drawing current.

Because it is difficult for a circuit to draw low current and still react quickly to restore $V_{CCP}$ to the desired potential when there is a large current draw which lowers $V_{CCP}$, it is beneficial to include a separate active circuit having an active regulator, one or more active clock circuits and associated active charge pumps. The active charge pumps may be responsive to the voltage $V_{CCP}$ as well as a signal RASBP which indicates when a circuit or device associated with the present invention is drawing current from $V_{CCP}$. Because the active regulator circuit includes components which draw more current and the active charge pump is larger and able to pump $V_{CCP}$ to a desired potential faster, $V_{CCP}$ can be maintained at the desired potential when a large amount of current is drawn by a circuit associated with the present invention, such as when the word lines are driven and more current is drawn to lower $V_{CCP}$.

Additionally, multiple active pumps can be used depending upon the amount of current drawn. For example, two active pumps can be used for a 16 MEG generation DRAM having the option to refresh with 2K cycles (versus 4K cycles). Since 2K cycles refresh twice as many word lines, twice as much current is drawn to lower $V_{CCP}$ in this type of DRAM. Therefore, depending upon the size of pump employed, it may be beneficial to use two or more charge pumps. Although the multiple active pumps can be driven by single active clock, each active pump preferrably is driven by a separate active clock.

Preferably these active clocks are self-timed clock circuits.

Finally, in an alternate embodiment, the active regulator can be removed and the active pumps can be activated whenever a certain condition occurs in a circuit coupled to the voltage generator of the present invention. For example, charge pumps can be activated in a DRAM whenever RASBP signal goes low, signaling that the word lines of the DRAM are accessed. Because $V_{CCP}$ is often lowered when the word lines are accessed, it is possible to design the pump and related circuitry to react quickly enough to restore the charge that is lost within the time that RASBP is low.

BRIEF DESCRIPTION OF THE DRAWINGS

In describing the preferred embodiment, reference is made to accompanying figures wherein.

DESCRIPTION OF PREFERRED EMBODIMENTS

First Embodiment

Figure 1:
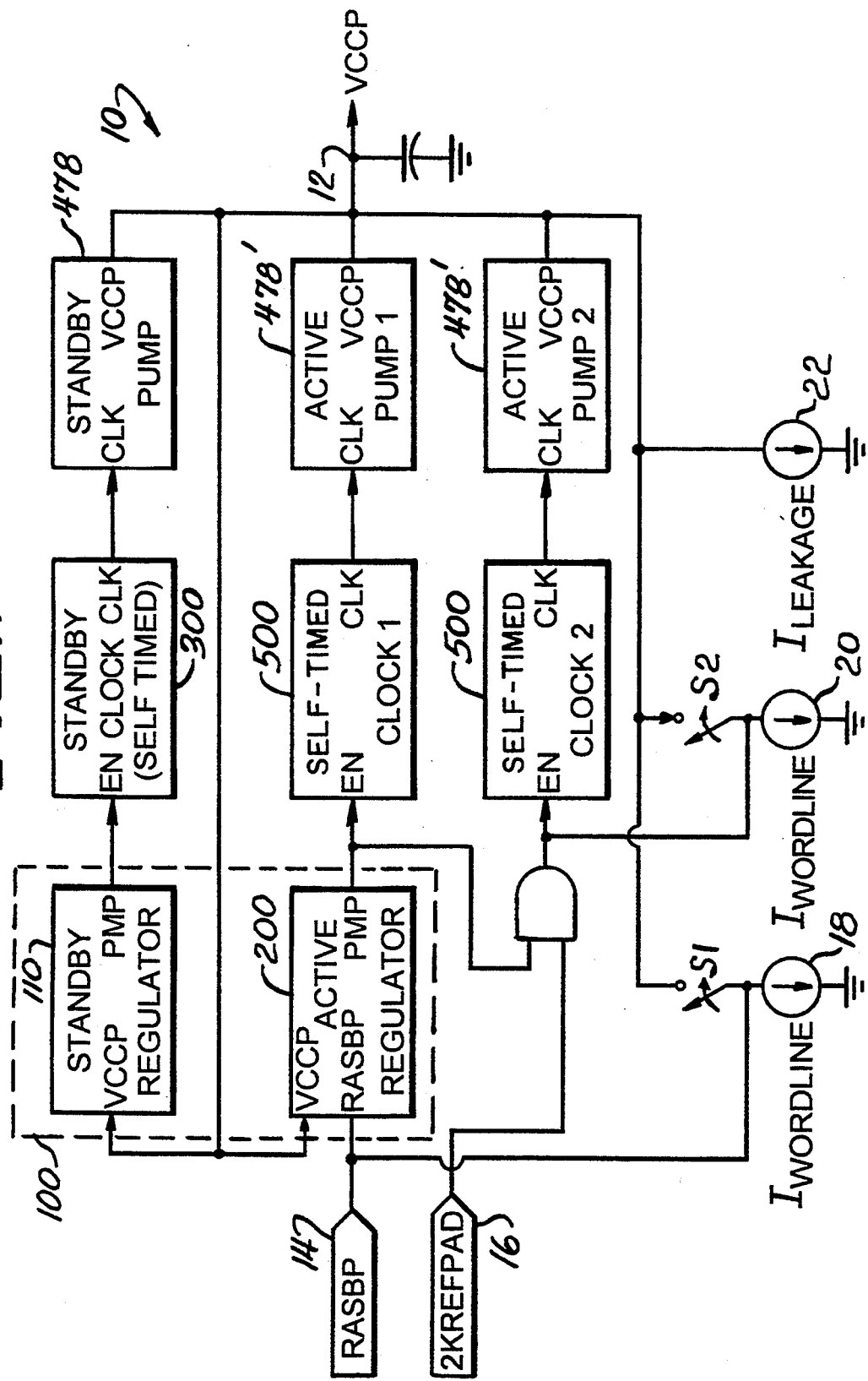
FIG. 1 is a block diagram of an embodiment of the voltage generator according to the present invention.

FIG. 1 is a block diagram of a voltage generator circuit 10 according to a first embodiment of the present invention. The voltage generator circuit of the present invention is used for generating, controlling, and maintaining a high voltage $V_{CCP}$ for low power applications in an integrated circuit, such as a DRAM or other memory device. Although the present invention is described in reference to a DRAM by way of example, this circuit could be employed in other circuits where the voltage at a node may drop and must be maintained at a certain voltage.

Circuit 10 produces its output voltage $V_{CCP}$ at a capacitive output node 12. Inputs 14 and 16 receive signals RASPB and 2KREFPAD, respectively. These are described infra. The voltage at output node 12 is used to drive word lines in an array of memory cells, for example, as represented by circuits 18 and 20 controlled by switches (e.g., decoders) S1 and S2 in FIG. 1. In a typical DRAM, the voltage $V_{CCP}$ will be low at initial power-up, as well as through leakage current. This voltage drop at $V_{CCP}$ is shown by a constant current source 22 in the block diagram of FIG. 1 representing the continuous current leakage. A voltage regulator circuit 100, including standby regulator 110 and active regulator 200, monitors the voltage $V_{CCP}$ to determine whether $V_{CCP}$ has dropped too low. When $V_{CCP}$ has dropped below a desired voltage, the standby regulator activates a standby clock 300 which outputs clock signals to drive a standby pump 478. Because standby regulator 110 is constantly running, it is designed to generally draw low current to minimize power consumption in the circuit. The standby circuits react quickly enough and pump enough current to maintain $V_{CCP}$ at a desired voltage as a result of leakage current 22.

However, a circuit may experience greater current loss other than merely leakage current and therefore may require an active pump. For example, when the word lines of a DRAM are driven, current is often drawn from node 12, as by operation of circuits 18 or 20, and this lowers the voltage $V_{CCP}$. Switches S1 and S2 are closed when RASBP goes low to show the current typically drawn in a DRAM when word lines are accessed or driven. Note that the constant current sources shown in the circuit are merely representative of current loss resulting from leakage or accessing the word lines.

A low RASBP enables active regulator circuit 200 to monitor $V_{CCP}$. If $V_{CCP}$ is low when the word lines are accessed, then the active regulator enables the active clock 500 to generate clock signals for active pump 478'. Generally, the active regulator 200 responds more quickly than the standby regulator 110 for pumping charge to maintain $V_{CCP}$ when word lines are accessed. Because active regulator 200 draws more current and consumes more power, preferably it is activated only if $V_{CCP}$ falls or has fallen below a desired value when the word lines are accessed. In addition, active pump 478' is a larger pump (i.e. able to pump more current than the standby pump) to pump charge to maintain $V_{CCP}$ more quickly when the word lines are accessed. Further, the active clock circuit 500 is a self-timed circuit and, therefore, eliminates the need for a free running oscillator. The self-timed feature will be discussed in more detail infra.

The 2KREFPAD input 16 is included to activate optionally a second active pump 478'. The second active pump and associated clock circuitry is employed when a 2K refresh cycle for the DRAM is used. When a 2K refresh cycle is used, twice as many word lines are accessed, drawing more current to lower $V_{CCP}$. While any number of active pumps could be used, these pumps (and related circuits) are preferably identical. Similarly, a single active self-timed clock 500 could drive multiple active pumps, or preferably, a separate active clock could drive each pump. Therefore, the description of active circuitry infra will refer to only one active pump and one active clock circuit.

Although both the active and standby circuits work in conjunction and may or may not operate at the same time, they will be described separately for ease of understanding.

The Regulator Circuit

Figure 2:
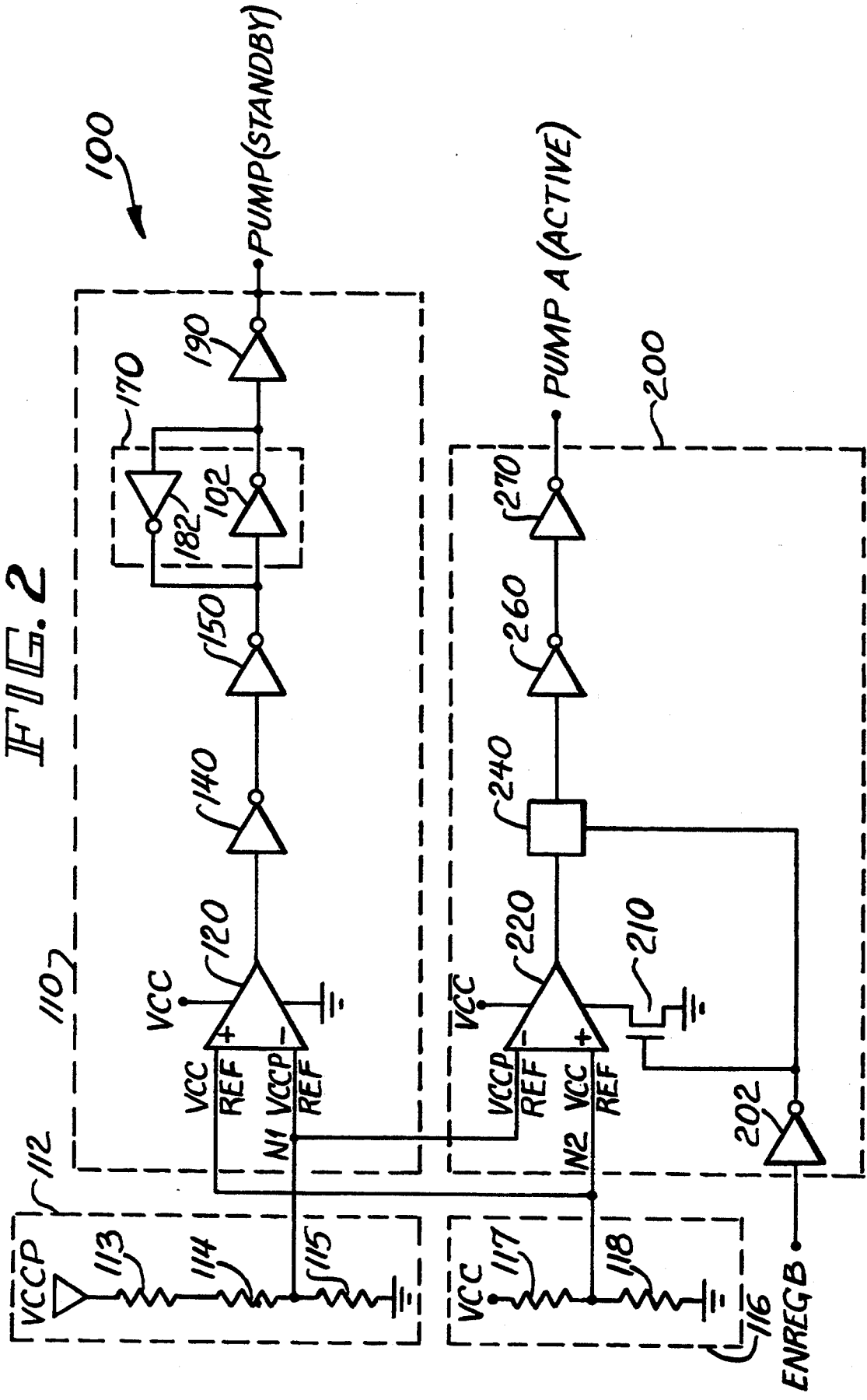
FIG. 2 is a block diagram of the voltage regulator circuit 100 including standby regulator circuit 110 and active regulator circuit 200 shown in FIG. 1.

Turning now to FIG. 2, a block diagram for regulator circuit 100, which monitors $V_{CCP}$ for both the standby circuits and active circuits, is shown. Regulator 100 includes a first resistor divider network 112, having resistors 113, 114 and 115 and an output node N1. Network 112 generates a reference signal $V_{CCPREF}$, which is proportional to the voltage $V_{CCP}$. In addition, a second resistor divider network 116, including resistors 117 and 118 and an output node N2, generates a reference voltage $V_{CCREF}$, which is proportional to a power supply voltage $V_{CC}$.

The voltage divider outputs $V_{CCREF}$ and $V_{CCPREF}$ are applied to positive and negative (non-inverting and inverting) inputs respectively of a differential amplifier 120 of the standby voltage regulator 110. When $V_{CCREF}$ exceeds $V_{CCPREF}$, the output of the differential amplifier 120 is high, outputting a high PUMP signal after being passed through a series of inverters 140, 150, a latch 170 and an inverter 190. The standby circuit is designed to limit power in the circuit, and to this end, inverters 140, 150, latch 170 and inverter 190 are included and do limit current in the circuit. The details of the inverters and latch will be described in reference to FIG. 3, infra.

Active regulator circuit 200 is also shown in FIG. 2 to contrast how standby regulator circuit 110 and active regulator circuit 200 compare the reference voltages at nodes N1 and N2 to output signals to enable the standby and active clock circuits, respectively, which drive the standby and active pump circuits, In addition to receiving $V_{CCREF}$ and $V_{CCPREF}$, active regulator circuit 200 receives an ENREGB signal and is enabled only under certain circumstances, Active regulator circuit 200 employs a differential amplifier 220 which also receives reference voltages $V_{CCREF}$ and $V_{CCREF}$ from resistor divider networks 112 and 116.

The active regulator circuit also includes an inverter 202 and an enabling transistor 210, Enabling transistor 210 is responsive to the ENREGB signal and enables or disables the differential amplifier 220 depending on whether word lines are being accessed. An enabling transistor is not used with differential amplifier 120 of the standby circuit which outputs a signal depending only upon the voltages at nodes N1 and N2, A switch 240 is also coupled to an inverter 202, Switch 240 controls whether the output of differential amplifier 220 is passed to a Schmitt trigger inverter 260 and an inverter 270 to output a PUMPA signal, The active regulator circuit 200 will be described in detail in reference to the active circuit.

Standby Circuits

Figure 3:
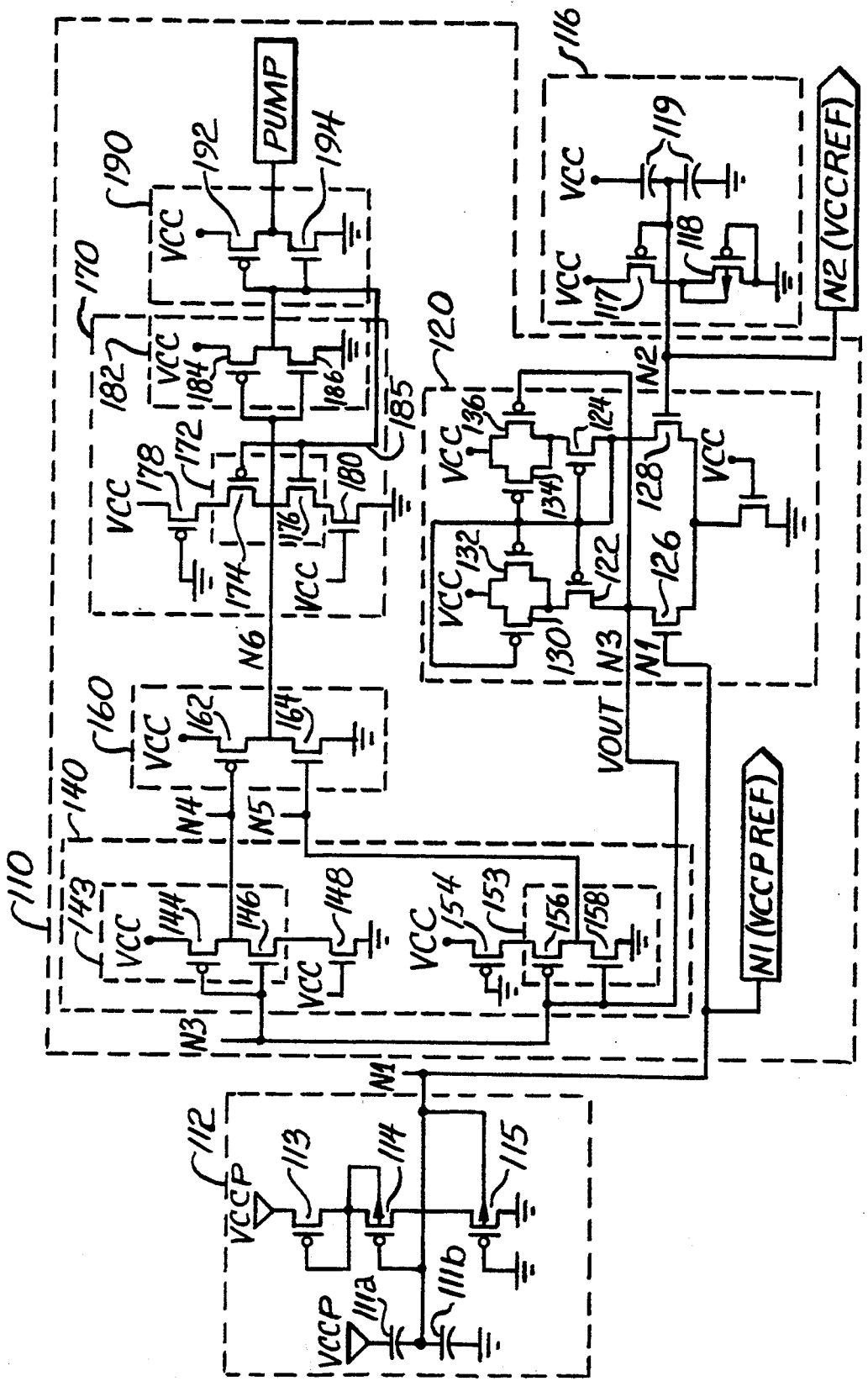
FIG. 3 is a detailed schematic of standby regulator circuit 110 (shown in FIG. 2) for the standby circuit.

Turning now to FIG. 3, having shown the general configuration of the voltage regulator circuit 100 in FIG. 2, additional features of the standby regulator circuit 110 which reduce current loss and power consumption are shown in the detailed schematic diagram. The preferred dimensions of the transistors in FIG. 3 (and the remaining figures) can be found in Appendix A, although other dimensions could be used within the scope of the invention. Also, the preferred devices shown in the schematic diagrams are those well known in the art (e.g. for example, transistor 114 of FIG. 3 is a P channel enhancement type transistor with the substrate coupled to the source), although other devices could be used. For example, all transistors are preferably enhancement type transistors, although depletion type transistors could be used.

In order to reduce power consumption, the standby voltage regulator circuit 110 of FIG. 3 is designed to generally operate on low current and limit current loss in the circuit. In the preferred standby regulator circuit, the resistor networks 112 and 116 include transistors configured as resistors (i.e., transistors each having the gate tied to the source or drain). Because the current through the transistors is a function of the ratio of the channel width/length ratio, the channel lengths of these enhancement transistors are generally long to limit current through the transistor networks.

However, by choosing long transistors in the resistor divider networks, the voltages at nodes N1 and N2 respectively will change slowly. Accordingly, capacitors 111 and 119 can be added at nodes N1 and N2 respectively to cause the voltage at the nodes to change more rapidly. Preferably, capacitor 111a is 2 pf and capacitor 111b is 1 pf. Capacitors 119 are preferably 1 pf. Although the transistors are preferably formed using metal and oxide layers on the device, transistors configured as capacitors could be used.

The differential amplifier circuit 120 preferably consists of a conventional configuration of transistors 122–128 and is used to compare $V_{CCREF}$ at a node N2 with $V_{CCPREF}$ at a node N1 to output a PUMP signal. The preferred dimensions of the transistors 122–128 (shown in Appendix A) of the differential amplifier circuit 120 are specifically chosen to keep current in the circuit low, and therefore minimize power consumption. Specifically, the width/length ratio of the transistors of the differential amplifier circuit 120 is preferably kept small by selecting long channel lengths to limit the current flow.

Although the long channel transistors of the differential amplifier circuit limit the current flow, the circuit will generally react slowly and will output a slow changing signal at node N3 (i.e. a signal which does not have a sharp transition between low and high states). A slow changing signal can often lead to current loss in a circuit, particularly when input to a two transistor inverter. Specifically, both transistors of the inverter will be on for a certain period of time, leading to "through current" or "crowbar current" through the series of transistors. Therefore, there is often current loss from $V_{CC}$ to ground by way of a two transistor inverter during the transition.

To compensate for the slow changing signal at node N3, transistors 130–136 are added to differential amplifier circuit 120. Generally, the sources of transistors 130 and 132 are coupled together at $V_{CC}$, while the drains of transistors 130 and 132 are also coupled together to transistor 122. The gate electrode of transistors 130 and 132 are coupled together and are coupled to the gates of transistors 122, 124 and 134. Similarly, the sources of transistors 134 and 136 are coupled together at $V_{CC}$, while the drains of transistor 134 and 136 are coupled together at transistor 124. The gate of transistor 136 is coupled to the output of the differential amplifier 120.

The operation of the conventional configuration of transistors 122–128 of differential amplifier circuit 120 is well known in the art. Transistors 130–136 are added to drive the output more quickly without drawing additional current. Particularly, these transistors drive the output $V_{OUT}$ at node N3 of the differential amplifier circuit 120 when output $V_{OUT}$ is at a transition point (i.e. a point between outputting a high and low signal).

For example, as $V_{CCPREF}$ at node N1 reaches a higher potential, transistor 126 begins to turn on harder, pulling node N3 low. Since node N3 is coupled to the gate of transistor 136, which is a p channel FET, it begins to turn on harder. Its source-drain path couples VCC to the source of transistor 124, which now reaches a higher potential and, therefore, turns on transistor 124 harder. This raises the potential at the drain of FET 124 and the gate electrodes of transistors 122, 130, and 132. This permits the output at node N3 to be pulled low even more quickly.

Conversely, circuit 120 acts to drive the output at node N3 high quickly as $V_{CCPREF}$ (node N1) begins to drop below $V_{CCREF}$ (node N2). Specifically, as $V_{CCPREF}$ begins to drop, FET 126 becomes less conductive, permitting the voltage at node N3 to begin to rise. When this happens, p channel transistor 136 becomes less conductive, which lowers the voltage at the source of transistor 124. As a result, the voltage at the drain of transistor 124 is lowered, turning on transistor 122, 130, and 132 harder and driving the output at node N3 high more quickly.

While transistor 130–136 are added to drive the output $V_{OUT}$ of the differential amplifier 120 more quickly, they are also designed to limit the capacitance at output node N3. It is beneficial to limit the capacitances at node N3 because it generally takes a longer time and more charge to drive a node coupled to a large capacitive load. Specifically, because the capacitance of a transistor is directly dependent upon the channel length, a long channel length will create a large capacitive load at the node coupled to the gate of the transistor (according to the equation: $C=c \cdot l \cdot w$, where c is the capacitance of the gate oxide per unit area, l is the length of the channel and w is the width of the channel). Therefore, transistor 136, which is coupled to node N3, is generally chosen to have a short channel length and width to limit the capacitance at the output.

To further compensate for the slow changing output $V_{OUT}$ of the differential amplifier 120 at node N3 (i.e., the slow changing output being a result of the differential amplifier which is designed to minimize the current in the circuit), inverters 140 and 160 and latch 170 are specifically designed to reduce the "through current" in the inverters and to output a PUMP signal (i.e. clock enabling signal) having a sharp transition. The switching time of transistors is generally dependent on the channel width/length ratio. Therefore, the channel widths and lengths can be chosen to establish when the transistors of the inverters will switch. Because the widths of the transistors in inverter circuit 140 are the same, the switching time will be a function of their channel lengths. The channel lengths of the transistors 144, 146, 156 and 158 of circuit 140 are chosen so that the voltages at nodes N4 and N5 (and therefore transistors 162 and 164 of circuit 160) switch at an appropriate time.

Specifically, when the voltage at node N3 transitions from a high signal to a low signal to change the voltage at node N6 from high to low, it is beneficial to turn off transistor 162 before turning on transistor 164 to limit through current from $V_{CC}$ to ground in inverter 160. To accomplish the switching of the transistors of inverter 160 in this order, the width/length ratios of the transistors of inverter 140 are selectively chosen. Specifically, the width/length ratio of transistor 144 is generally greater than that of transistor 156. As a result, transistor 144 turns on before transistor 156 turns on. Therefore, node N4 is pulled high before node N5 is pulled high to ensure that transistor 162 switches before transistor 164.

In contrast, when $V_{out}$ transitions from a low signal to a high signal, it is beneficial to turn off transistor 164 before turning on transistor 162 to limit through current from $V_{CC}$ to ground. Therefore, the width/length of transistors 146 and 158 are selectively chosen. Specifically, the width/length ratio of transistor 158 is generally greater than that of transistor 146. As a result, transistor 158 turns on before transistor 146 turns on. Therefore, node N5 is pulled low before node N4 is pulled low to ensure that transistor 164 turns off before transistor 162 turns on. Accordingly, the selection of channel lengths of the transistors of inverter circuit 140 reduces any current path from $V_{CC}$ to ground in inverter 160 during either transition.

To further limit through current in the voltage regulator circuit, transistors 148 and 154 are added to inverter 140 to eliminate any through current in inverters 143 and 153. Because of the "current-limiting" transistors 148 and 154 have long channel lengths, nodes N4 and N5 will not be pulled rapidly to ground and $V_{CC}$ respectively. Therefore, a path from $V_{CC}$ to will exist while driving transistors 162 and 164, but the current will be reduced in the series of transistors 144–148 and 154–158 by the long channel lengths of transistors 148 and 154.

Also, transistors 148 and 154 are selectively positioned to ensure that the timing of the switching of the transistors as described above is not affected. When node N3 transitions from high to low, it is preferable that the inverter 143 drive N4 high very quickly by turning on transistor 144 to shut off transistor 162. Therefore, "current-limiting" transistor 148 is added only to the n-channel side of the inverter 143 to limit the effect of transistor 148 on transistor 144. Specifically, because it is beneficial for transistor 144 to switch quickly and drive node N4 high quickly, no current limiting transistor is added to the p-channel side of inverter 143 (between transistor 144 and $V_{CC}$). While "current-limiting" transistor 148 does effect the timing of driving node N4 low when node N3 transitions from low to high, the capacitive coupling of transistor 148 to node N4 is large enough to pull node N4 low enough to turn on transistor 162 at an appropriate time.

Similarly, when node N3 transitions from low to high, it is preferred that inverter 153 drive node N5 low very quickly by turning on transistor 158 to shut off transistor 164. Hence, the "current-limiting" transistor 154 is added only to the p-channel side of inverter 153 to limit the effect of transistor 154 on transistor 158. A current limiting transistor is not added in series between transistor 158 and ground in order to avoid limiting the rate at which transistor 158 pulls N5 to ground. Although "current-limiting" transistor 154 does affect the timing of driving node N5 high when node N3 transitions from high to low, the capacitive coupling of transistor 154 to node N5 is large enough to pull node N5 high enough to turn on transistor 164 at an appropriate time.

It should be understood that while the preferred embodiment employs a specific differential amplifier circuit 120 shown in FIG. 3, other circuits which compare two signals to provide an output could be used within the scope of the present invention.

Finally, the standby regulator circuit 110 includes a latch 170 to maintain the output of the PUMP signal during the period when neither transistor 162 nor transistor 164 of inverter 160 is on (as discussed above to prevent through current). The inverted PUMP signal is fed back via line 185 to transistor network 174–180 to maintain the original voltage at node N6 until the state of N6 changes when invertor 160 drives node N6.

In order to reduce the power consumption of the oscillator, latch 170 itself is designed to limit the through current while also providing a weak latch. Transistors 162 and 164 are generally small transistors (i.e., small widths and lengths) to limit the current required from inverter 140 to switch inverter 160. However, because of their size, they generally cannot drive a large capacitive load at node N6. Too large a capacitance at node N6 is undesirable because this capacitance will cause the voltage at the node to switch slowly. Therefore, a weak latch is provided at node N6 by selecting transistors 174 and 176 to have smaller widths and lengths, preferably on the order of 1–2 μm, to limit the capacitance.

However, because transistors 174 and 176 of the latch have widths and lengths which are about equal, they also have a large width/length ratio and drive greater current. Therefore, "current-limiting" transistors 178 and 180 are included. These transistors have long channel lengths (and therefore small width/length ratios) to limit the current in the latch 170 and reduce power consumption in the circuit.

Clock Circuits

Figure 4:
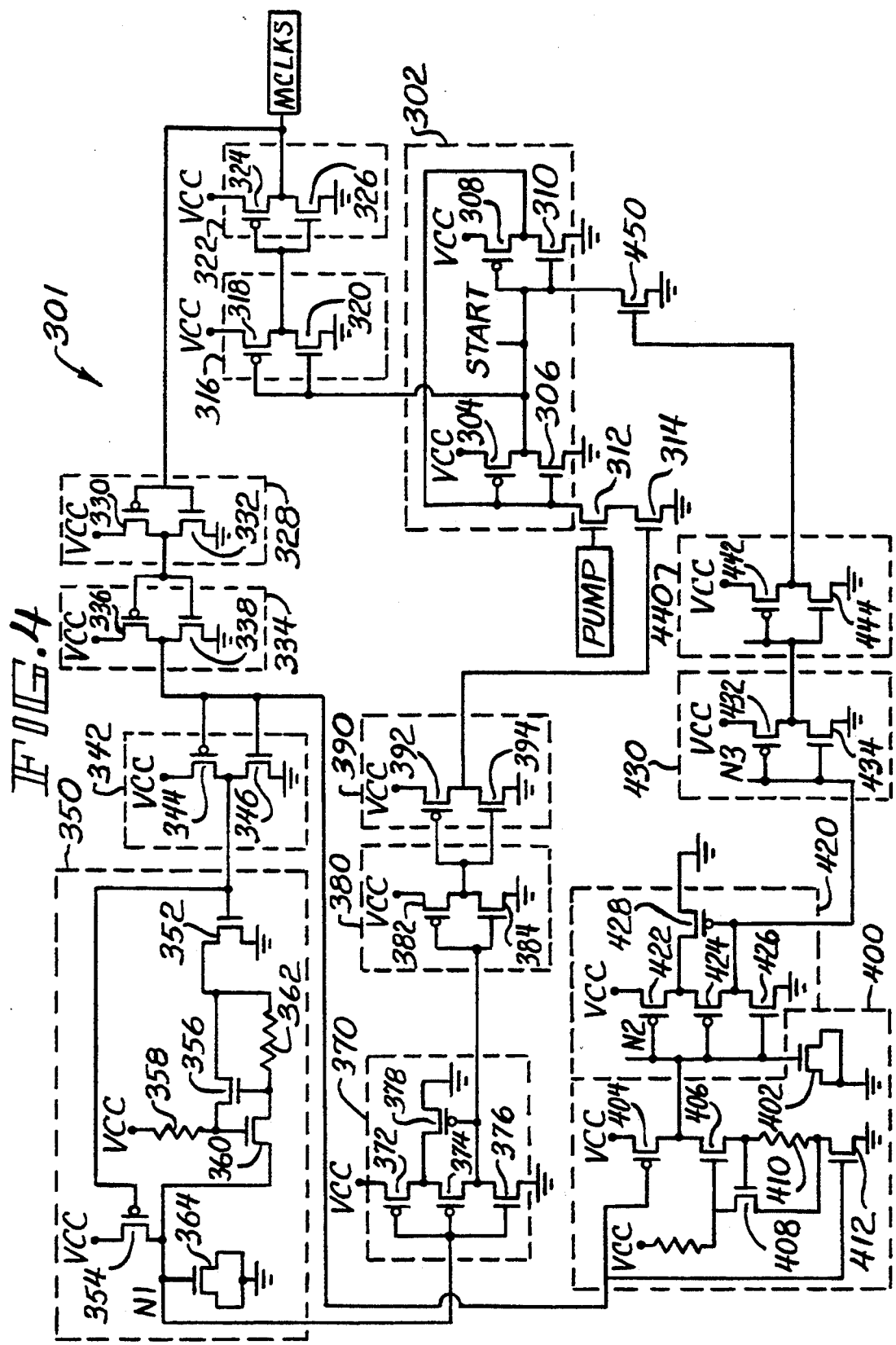
FIG. 4 is a detailed schematic of the standby master clock circuit of the standby clock circuit for generating a standby master clock signal.

Turning now to FIG. 4, having shown the detailed schematic of the standby regulator circuit 110, the description of the remaining circuitry of the standby circuit (i.e. the standby clock circuits and the standby pump circuit) will be in described in reference to the various cycles of the pump. The master clock circuit 301 for the standby clock 300 is shown in FIG. 4. Circuit 301 receives the PUMP signal at an input and produces a master clock output signal MCLKS. As will become apparent in reference to the charge pump circuit (shown in FIG. 9), the pump circuit pumps on a two-cycle principle: a precharge cycle and a pumping cycle. Therefore, the clock circuit must generate appropriate signals during these cycles. The clock signals generated during the pumping cycle will be described first, followed by the clock signals generated during the precharge cycle.

The operation of the standby master clock circuit 301 of FIG. 4 which generates the master clock signal MCLKS for the standby circuit will be described first, followed by the operation of a clock circuit 445 shown in FIG. 5. As described in reference to the block diagram of FIG. 2, when the constantly running standby regulator 110 (FIG. 3) detects that $V_{CCPREF}$ has fallen below a selected value, the standby regulator will output a high PUMP signal. The PUMP signal is a demand signal applied to the FIG. 4 circuit and is shown as an input thereto (center of FIG. 4). At the beginning of the precharge pump cycle, a high PUMP signal drives the gate of a transistor 312 high. Initially, as described infra, FET 314 is on, so that when FET 312 turns on, it pulls the gates of transistors 304 and 306 low. Transistors 304 and 306 form an inverter having an output node "START," which thus is pulled high. The output MCLKS of master clock circuit 301 is high after START is transmitted through a sequence of inverters 316 and 322. Although preferably a high pump signal and MCLKS signal are generated by the circuits to drive the charge pump, the circuits could be configured to generate active low pump and MCLKS signals within the scope of the present invention.

Because the MCLKS signal is used to enable a clock circuit 445 (shown in FIG. 5) which generates clock signals to drive the standby pump (shown in FIG. 6) during different cycles, MCLKS varies during the different cycles. Therefore, a feedback operation of standby master clock circuit 301 is provided, and circuit 301 is designed to change the MCLKS signal (i.e., between a binary low and binary high signal). This aspect of the circuit will be described first, followed by a description of the clock circuit 445 which receives the MCLKS signal.

While the pumping cycle is completed when MCLKS is high, MCLKS is fed back through circuit 301 of FIG. 4 to generate a low MCLKS during the precharge cycle to reset the inputs and voltages at the nodes of the pump circuit for the next pumping cycle. After passing through inverters 328 and 334, the MCLKS signal follows two feedback paths. Two paths are designed to establish the proper voltages at node START for the precharge and pumping cycles. Depending on the state of MCLKS, the MCLKS signal generally will be transmitted through the circuit quickly in one of the paths, while a delay will be provided in the other path. Generally, a first feedback path exists through an inverter 342, a delay circuit 350, and gates 370, 380 and 390. A second feedback path is provided by a delay circuit 400 (having inputs at the gate electrodes of transistors 404 and 412) and inverter 430 and 440. Because the signal from the faster path (i.e. either the first or second path, depending upon the state of MCLKS) reaches a latch 302 (next to the pump input) first and, therefore, establishes a condition of the latch, the fast path will be discussed first, followed by the slow path.

When MCLKS is high (for example, during the pumping cycle), the signal is passed through inverters 328 and 334 and a high signal is input to inverter 342. The output of inverter 342 is low, turning on a transistor 354 and turning off a transistor 352. Because there is no path from a node N1 to ground through transistors 352 and 360, capacitor 364 is pulled to $V_{CC}$ via the source-drain path of FET 354. As a result, capacitor 364 charges quickly, providing the fast path through the circuit to latch 302. Specifically, the voltage at node N1 is transmitted through Schmitt Trigger inverter 370 and inverters 380 and 390 to output a low signal at the gate of a transistor 314, turning it off. With transistor 314 off, the circuit ignores the PUMP signal at the gate of transistor 312, even if the PUMP signal is high. It will be seen that when PUMP went high, with transistor 314 on, the input at the left side of latch went low, drove START high, and was inverted again and supplied back to the input at the gates of transistors 304 and 306. The latch will eventually be reset into the other state when a transistor 450 becomes conductive, pulling START low. START cannot go high again until transistor 304 turns on, which cannot occur until PUMP is high and transistor 314 is on. From this, it will be appreciated that turning off transistor 314 at this time allows further actions to occur before a new START signal is generated. This is part of the self-timed feature of the circuit. Accordingly, an oscillator is not needed to provide timing for the clock circuit.

With regard to the slow path, the output of inverter 334 is input to delay circuit 400 (which provides the slow path of the circuit in this case). Because the output of inverter 334 is high, transistor 404 is off and transistor 412 is on. Therefore, a path from a capacitor 402 through transistor 406 and resistor 410 is provided to ground, leading to the discharge of capacitor 402. Because capacitor 402 is relatively large, preferably 1.2 pf, and resistor 410 is also large, preferably 10KΩ, this discharge of the capacitor provides a long delay (preferably 40–60 nanoseconds). The delay provided by discharging the capacitor is established to ensure the pump circuit 478 completes the pumping cycle (described in detail in reference to the pump circuit).

The voltage at node N2 of the capacitor 402 is input to a Schmitt Trigger inverter 420 and inverters 430 and 440 to provide an output to the gate of a transistor 450. The high output at the gate of the n-channel transistor 450 turns it on, thereby pulling the node START to ground and inverting the latch 302. The low voltage at the node START is transferred through inverters 316 and 322 to provide a low MCLKS output signal which starts the precharge cycle of the pumping circuit to prepare the circuit for the next pumping cycle. Even though START is now low, it cannot be brought high via latch 302 because the fast path caused transistor 314 to turn off. Since the path to ground for the gate of p-channel transistor 304 goes through the source-drain path of transistor 314, the precharge cycle will continue.

When master clock MCLKS is low, MCLKS is passed through inverters 328 and 334, providing a low output of inverter 334. The output of inverter 342 is high, turning off transistor 354 and turning on transistor 352. Because a path from capacitor 364 to ground is provided by way of transistors 360 and 352, allowing for the discharge of capacitor 364 (i.e., node N1), the delay through delay circuit 350 is long, while the delay through delay circuit 400 is short. Therefore, the passage of the low MCLKS through delay circuit 350 will be described after the short path through delay circuit 400.

The low output signal of inverter 334 is input to transistors 404 and 412 of delay circuit 400. The low signal turns on transistor 404 and turns off transistor 412. Therefore, the capacitor 402 is coupled to $V_{CC}$ via transistor 404 and the capacitor charges quickly, pulling the voltage at node N2 high. The voltage at node N2 is transmitted through Schmitt trigger inverter 420 and inverters 430 and 440. A low output of inverter 440 is input to transistor 450. The low signal at the gate of transistor 450 turns off the transistor, thereby releasing the clamp to ground, and allows the pumping cycle to begin again after (1) the signal passes through the slow path (i.e., delay circuit 350) to turn on transistor 314, and (2) the circuit receives an active pump signal at transistor 312 to reset latch 302.

When the low MCLKS passes through delay circuit 350 (i.e., during the precharge cycle), the discharge of capacitor 364 generally provides a delay. Specifically, the low output of inverter 334 is input to inverter 342. The output of inverter 342 is input to delay circuit 350. The high input turns on transistor 352 and turns off transistor 354. As a result, a path is provided from capacitor 364 to ground by way of transistor 360, a resistor 362 (preferably 10KΩ and transistor 352. A transistor 356 and resistor 358 (preferably 10KΩ) are added to maintain a constant current in the path from node N1 to ground and, therefore, establish a set delay. During this delay, the inputs to the charge pump circuit and voltages at various nodes of the charge pump are reset for a subsequent precharge and pumping cycle.

As the voltage at node N3 goes low as capacitor 364 discharges, the voltage is transmitted through Schmitt trigger 370, inverter 380 and inverter 390 to provide a high signal at the gate of transistor 314. A high signal at the gate of the n-channel transistor 314 turns on the transistor and allows transistor 312 to receive the pump signal for the subsequent pumping cycle.

This delay for the precharge cycle (set by delay circuit 350) is generally shorter than the delay for the pumping cycle (set by delay circuit 400) by providing a smaller capacitor which is discharged. A long delay during the precharge cycle is not required because the internal voltages in the pump reach precharge levels more quickly. This is because the gate-to-source voltages are higher and can react or provide more current at a faster rate.

To recapitulate, the standby master clock circuit 301 shown in FIG. 4 is responsive to an active PUMP signal (or clock enabling signal from the standby regulator circuit shown in FIG. 3 when $V_{CCPREF}$ drops below a certain value) and generates the MCLKS signal. MCLKS is fed back through the circuit and varies during different cycles. MCLKS is input to the clock circuit 445 shown in FIG. 5. As MCLKS transitions high or low, clock circuit 445 generates different clock signals during the different cycles to drive the charge pump. The circuit is self-timed. It completes the full cycle for pumping and for precharge once initiated by the active PUMP signal even if that signal terminates during the full cycle.

Figure 5:
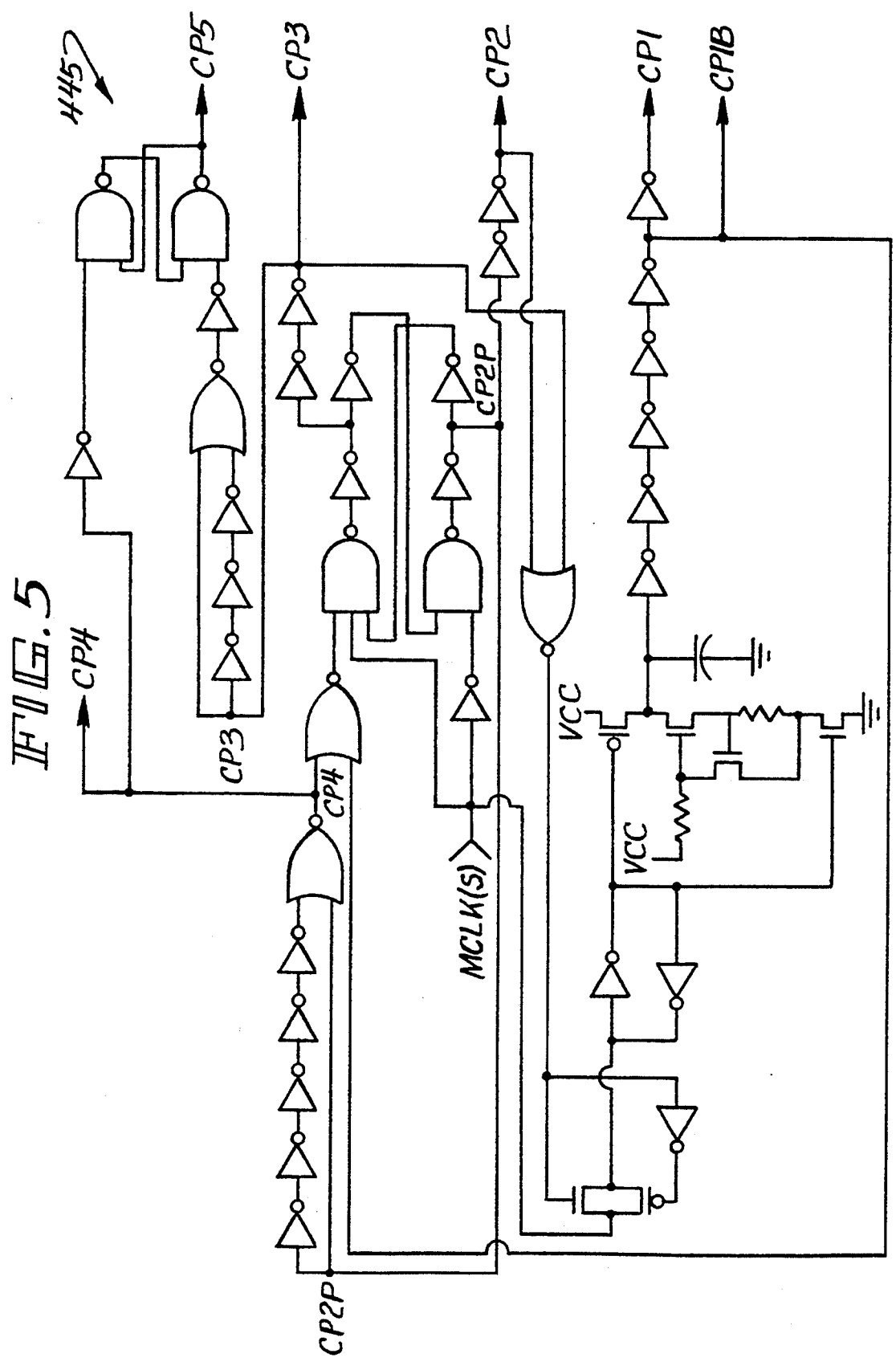
FIG. 5 is a block diagram of the clock circuit for both the standby clock and the active clock for generating clock signals for the standby pump and the active pump, respectively.

Turning now to FIG. 5, clock circuit 445 is shown. Clock circuit 445 receives MCLKS at an input and outputs signals CP1 through CP5. This circuit shows the preferred configuration of gates to generate the signals to drive the charge pump in FIG. 6. The signals generated by clock circuit 445 are shown in the timing diagram of FIG. 7. Clock circuit 445 uses a series of gates and feedback paths to generate the outputs shown in the timing diagram of FIG. 7. The operation of each gate shown in FIG. 5 is well known in the art. Generally, each signal is a part of a feedback loop to provide an inverted output depending on the status of the signals. As a result, the outputs transition based upon the state of the master clock signal as well as the previous signal.

Figure 7:
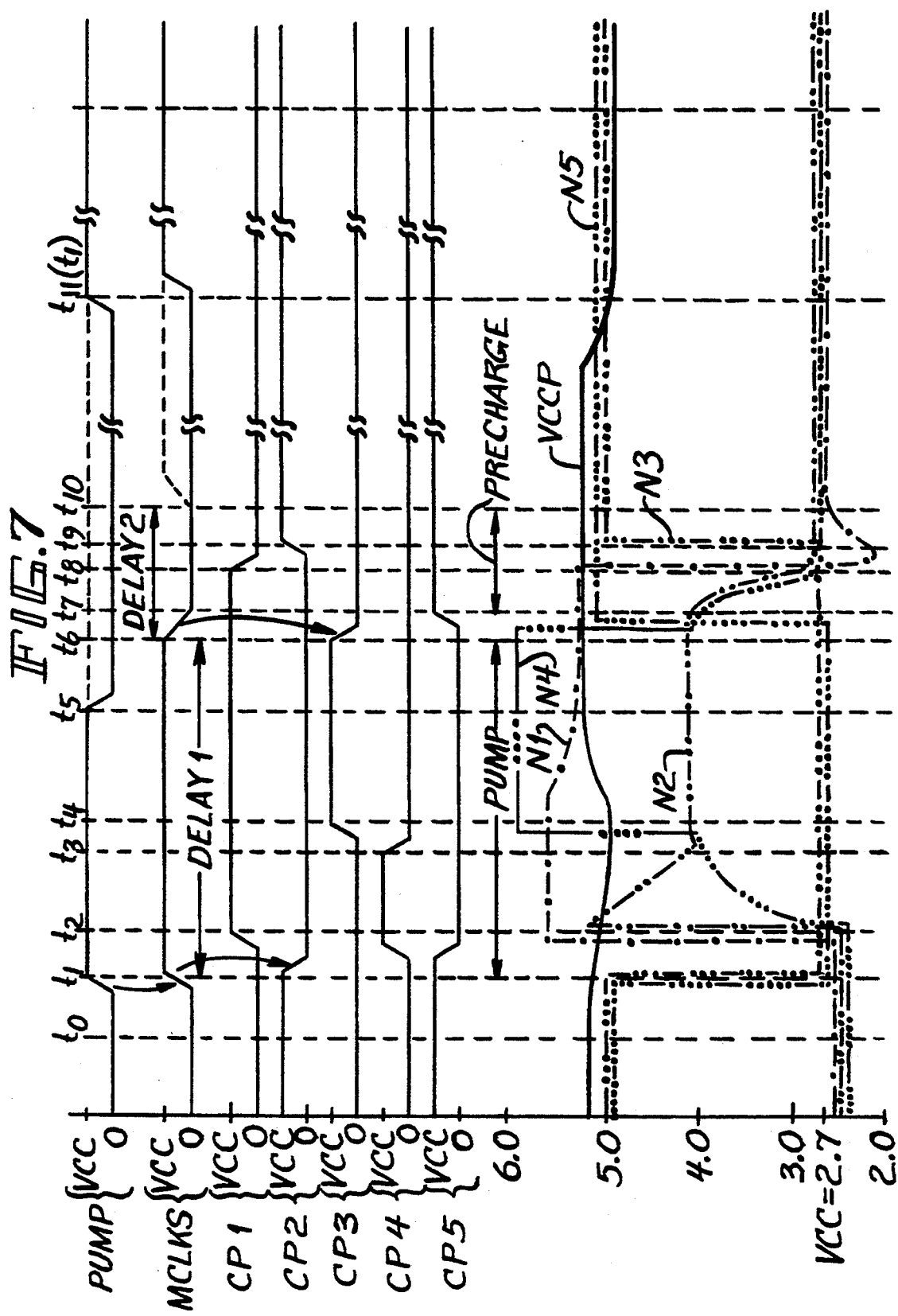
FIG. 7 is a timing diagram for the input and output signals and voltages at various nodes of the standby pump circuit.

The configuration of the gates is designed to establish the signals shown in FIG. 7. One skilled in the art could follow the MCLKS input signal to generate the output signals in FIG. 7 at any period based upon the previous input signals. While the preferred clock circuit is shown in FIG. 7, any other circuit or other means of generating signals (CP1–CP4) shown in FIG. 7 could be used within the scope of the present invention to generate the input signals to the pump circuits.

The function of the clock signals generated by the circuit of FIG. 5 will be described in detail in reference to the operation of the charge pump of FIG. 6. The clock signals are shown as a function of time in FIG. 7. The structure of the charge pump circuit will be described in detail, followed by a detailed description of the operation of the charge pump.

Pump Circuit

Figure 6:
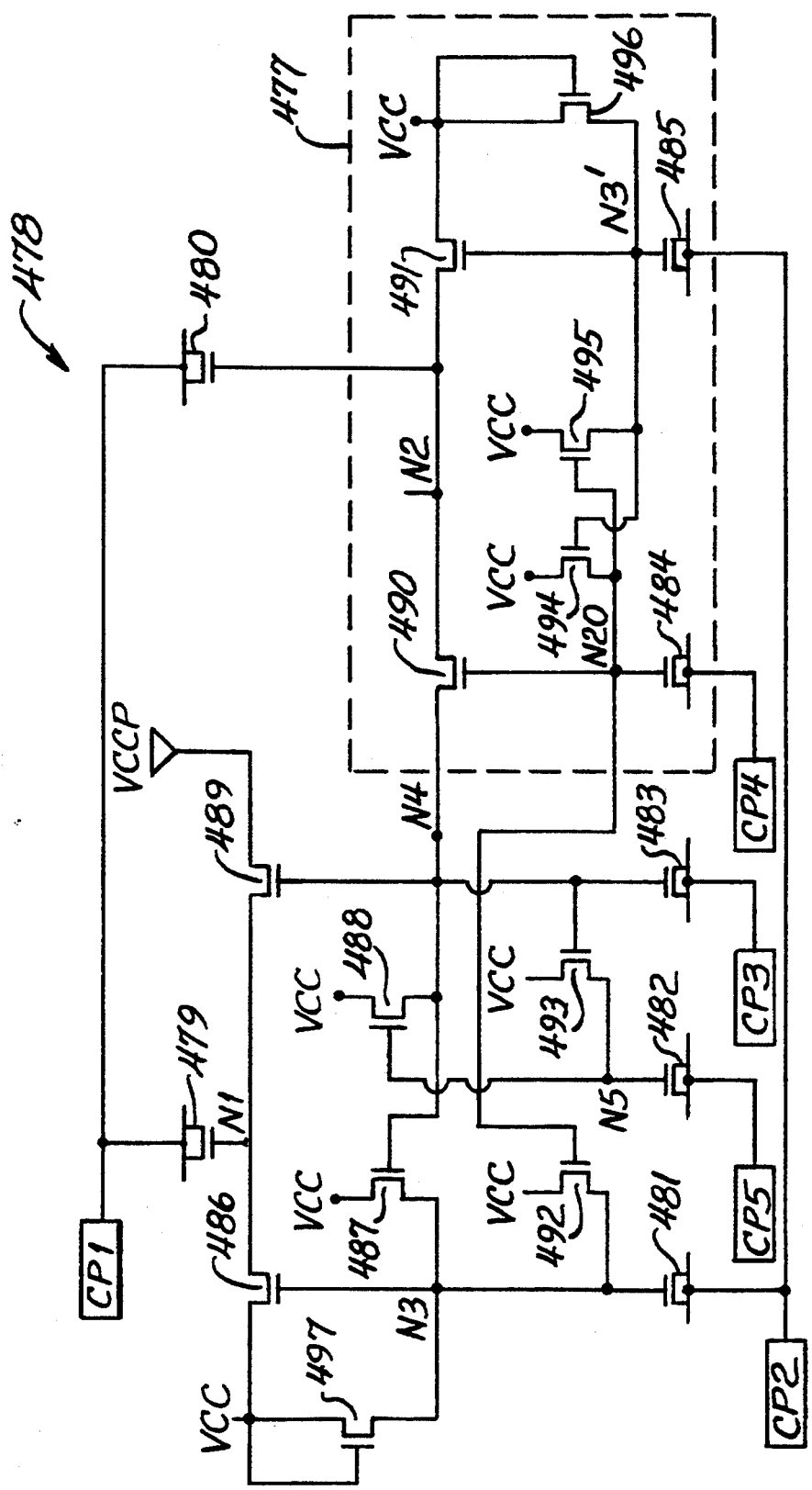
FIG. 6 is a schematic diagram of the pump circuit used for the standby pump and the active pump.

Turning now to FIG. 6, the charge pump circuit is shown. The charge pump preferred for use the present invention is disclosed in co-pending U.S. application Ser. No. 07/964,003, filed on Oct. 20, 1992 and owned by the assignees of the present invention (attorney docket number UM 104), the entire specification of which is incorporated herein by reference. Pump 478 receives at several inputs the clock signals CP1 through CP5, and provides an output $V_{CCP}$ while the operation of the pump is shown having a 2.7 volt $V_{CC}$, some other value of $V_{CC}$ could be used. The use of a 2.7 volt $V_{CC}$ is simply illustrative.

The charge pump of the present invention is a hybrid two-stage charge pump having a first stage 477. Charge pumped to a node N4 during the first stage of a pump cycle (by first stage 477) is used to enable the charge pump to pump charge from a node N1 to $V_{CCP}$ during a second stage of the pumping cycle. Generally, signal CP1 is used to drive nodes N1 and N2 to a greater potential by way of capacitors 479 and 480. Signals CP2, CP3, CP4 and CP5 are generally used to regulate the operation of the remaining transistors in the circuit to pump charge to $V_{CCP}$ during the pumping cycle, and to reset the nodes during the precharge cycle.

Referring to the pump circuit of FIG. 6 and the associated timing diagram of FIG. 7, the operation of the pump circuit will be described. The input signal to the pump circuit and the voltages at various nodes are shown at $t_0$ when the pump circuit is in a quiescent state. As stated earlier, the input signals CP1 to CP5 are established by the clock circuit 445 shown in FIG. 5, while the voltage at the nodes of the pump circuit in FIG. 6 are determined by the clock signals CP1–CP5. Initially, CP2 is high ($V_{CC}$), turning on transistors 486 and 491 to maintain nodes N1 and N2 at $V_{CC}$.

At a time $t_1$, PUMP signal goes high (after the standby voltage regular circuit 110 shown in FIG. 3 detects a drop in $V_{CCP}$). As described in reference to the standby master clock circuit 301 of FIG. 4, the MCLKS signal also goes high. As MCLKS is passed through the clock circuit 445 shown in FIG. 5, CP2 goes low (0 volts), turning off transistors 486 and 491 to prevent any transfer of charge from node N1 by way of transistor 486 to $V_{CC}$ and to prevent any transfer of charge from node N2 by way of transistor 491 to $V_{CC}$. CP4 also goes high to turn on transistor 490 and to allow transfer of charge from N2 to N4 (when CP1 goes high at $t_2$). Also, CP5 goes low to turn off transistor 488 and unclamp node N4 from $V_{CC}$.

At a time $t_2$, CP1 goes high, driving the voltage at nodes N1 and N2 to approximately 2 $V_{CC}$ (or 5.4 volts for a 2.7 volt $V_{CC}$). Because transistor 490 is on, node N4 approaches 2 $V_{CC}$ (or approximately 2 $V_{CC}$ minus $V_t$, or 3 $V_{CC}/2$). This transfer of charge is necessary to turn on transistor 489 at a time $t_4$.

At a time $t_3$, CP4 goes low to turn off transistor 490 and to end the first stage of the pumping cycle of node N4 by preventing a transfer of charge from node N4 to node N2.

At time $T_4$, CP3 goes high to start the second stage of the pumping cycle. A high CP3 signal further increases the voltage at N4 and, turns on transistor 489 to allow the transfer of charge from node N1 to $V_{CCP}$. As is apparent in FIG. 7, the charge at node N1 and $V_{CCP}$ begin to equalize.

At a time $t_5$, the pump signal may or may not go low (as shown by the dotted line), depending on whether $V_{CCP}$ has been restored to its desired value. The dashed line designating a high pump signal is shown in FIG. 7 and will be discussed further in regard to the end of the precharge cycle (at time $t_{10}$).

At a time $t_6$ (regardless of whether $V_{CCP}$ is restored to its desired value), the pumping cycle is complete as the high MCLKS signal is fed back through the master clock circuit 301 (discussed in FIG. 4). As MCLKS goes low, CP3 goes low to end the pump cycle.

The pump must then reset the inputs (CP1–CP5) and the voltages at the nodes (N1–N5) to their quiescent values for the next precharge and pumping cycle. At a time $t_7$, CP5 transitions high to couple node N4 to $V_{CC}$. At a time $t_8$, CP1 transitions low to drive nodes N1 and N2 to $V_{CC}$. At a time $t_9$, CP2 goes high to couple nodes N1 and N2 to $V_{CC}$ and maintain the voltage at the node.

At a time $t_{10}$, MCLKS has passed through master clock circuit 301 to turn on transistor 314, making latch 302 ready to respond to an active pump signal. If enough charge had not been pumped as of $t_5$ (i.e., the PUMP signal had not gone low as indicated by the dashed line), pumping would begin at time $t_{10}$ as MCLKS goes high (as shown in the dashed line). The precharge cycle would again begin as shown at time $t_1$. Otherwise, the circuit remains in a quiescent state until a time $t_{11}$, when $V_{CCP}$ has again dropped and an active PUMP signal is generated by the standby regulator 110 to begin the pumping cycle again.

To recapitulate, the standby circuit of the present invention monitors $V_{CCP}$ and activates the standby charge pump to maintain a desired voltage at $V_{CCP}$. Generally, the standby regulator circuit, clock circuit and standby pump are designed to consume low power. Specifically, only the standby regulator circuit is constantly operating to monitor $V_{CCP}$ and is specifically designed to minimize power consumption. The clock circuit and pump circuits are enabled and draw current only when $V_{CCP}$ has dropped below a desired value, due typically to leakage current or initial power up.

Active Circuit

Having shown the standby circuit which continuously monitors $V_{CCP}$ to determine if $V_{CCP}$ has fallen due to leakage current, the active circuits (500) will now be described. Generally, active circuit 500 includes active regulator 200 (FIG. 8), active master clock 501 (FIG. 9), clock circuit 445 (FIG. 5) and pump circuit 478' (FIG. 6). As mentioned earlier, the active circuits operate independently of (although simultaneously with) the standby circuits and are enabled when the word lines of a DRAM are accessed, as indicated by a RASBP signal. If $V_{CCP}$ drops below a desired value when the word lines are accessed and the active circuit is enabled, the active pump (which is generally a larger pump than the standby pump) will pump charge to $V_{CCP}$ to maintain the desired voltage at $V_{CCP}$.

Figure 8:
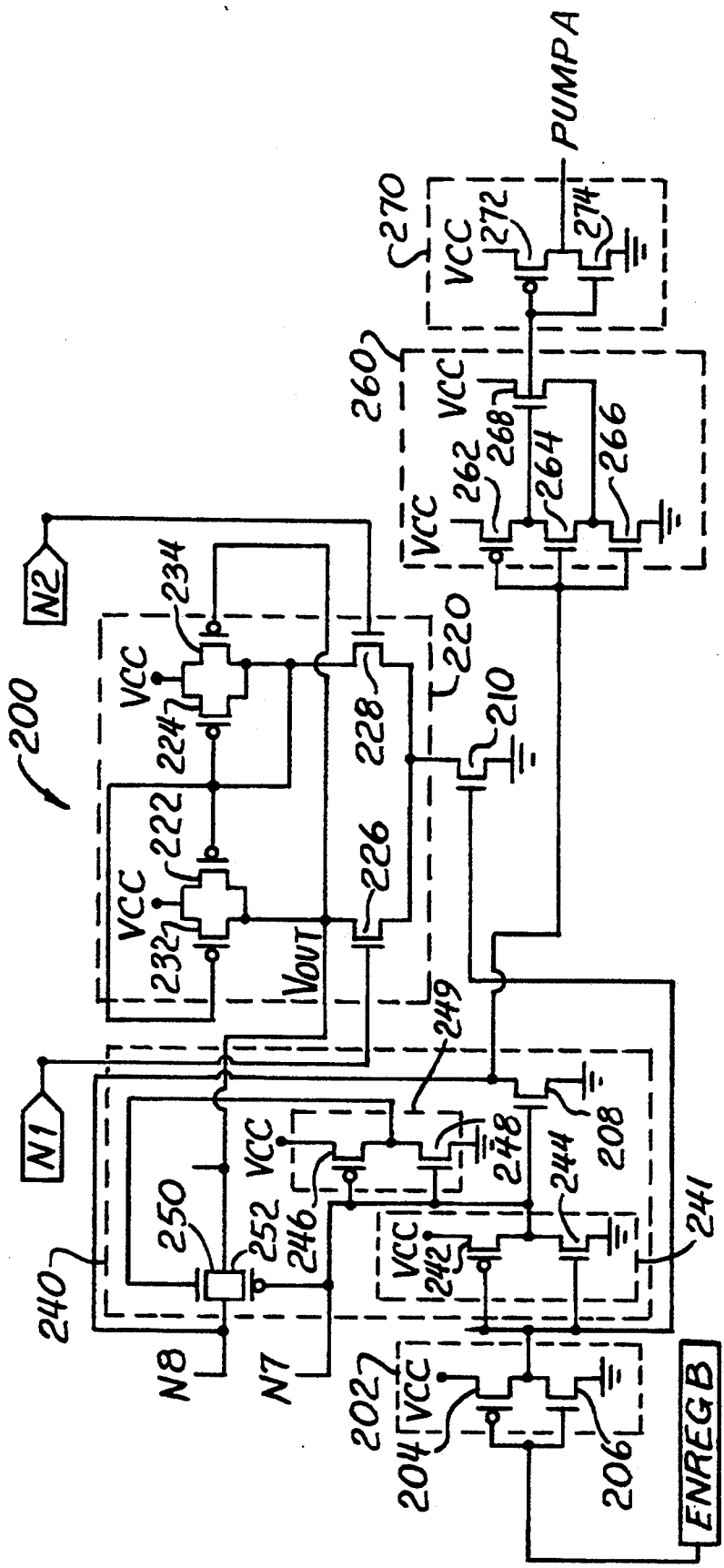
FIG. 8 is a detailed schematic of the active regulator circuit 200 shown in FIG. 2 for the active circuit.

Turning to FIG. 8, active regulator circuit 200 (also shown in block form in FIGS. 1 and 2) also regulates the voltages $V_{CCPREF}$ and $V_{CCREF}$ at nodes N1 and N2, respectively, to determine if $V_{CCP}$ has fallen below a desired value. Unlike the standby regulator 110 which activates standby clock 300 whenever $V_{CCP}$ drops below a desired value, the active regulator 200 also receives an ENREGB signal, which enables or disables the active regulator circuit 200. The state of ENREGB signal is determined, for example, by whether the word lines of a DRAM are driven and, therefore, the circuit is drawing current which lowers $V_{CCP}$.

Specifically, a low ENREGB signal is inverted by inverter 202 and drives the gate of transistor 210 to enable differential amplifier 220. Differential amplifier 220 includes the conventional configuration of transistors 222-228. The operation of the differential amplifier is well known in the art. However, the differential amplifier further includes transistors 232 and 234 to enable the amplifier to respond more quickly to provide an output at $V_{OUT}$. Transistors 232 and 234 generally serve the same functions as transistors 130 to 136 of standby differential amplifier 120 (FIG. 3). However, because long channel transistors are not used in this differential amplifier (unlike those of the standby differential amplifier 120) to limit current, the capacitance at the output node $V_{OUT}$ is not as great. Therefore, transistors 232 and 234 could be coupled in parallel to transistors 222 and 224, respectively, to more quickly drive the output without increasing the capacitance at the output node $V_{OUT}$.

A switch 240 is also responsive to the ENREGB signal to allow the output of the differential amplifier 220 to be output as a PUMPA signal (similar to the PUMP signal of the standby master clock circuit). Specifically, a low ENREGB signal is twice inverted by inverters 202 and 241, so node N7 is also low and is coupled to the gate of transistor 208, turning off the transistor. The low output of inverter 241 is inputted to inverter 249 and is also applied to the gate of transistor 252, which turns on. The output of inverter 249 turns on transistor 250, providing a path from the output of the differential amplifier ($V_{OUT}$) to the output at PUMPA by way of inverters 260 and 270. Specifically, the output $V_{OUT}$ of differential amplifier 220 is transmitted through the switch 240 to node N8. Node N8 is coupled to a Schmitt trigger inverter 260, the output of which is inverted by an inverter 270 to provide the output signal PUMPA. The PUMPA signal is used by the active master clock circuit 501 (shown in FIG. 9) to generate a MCLK signal.

Figure 9:
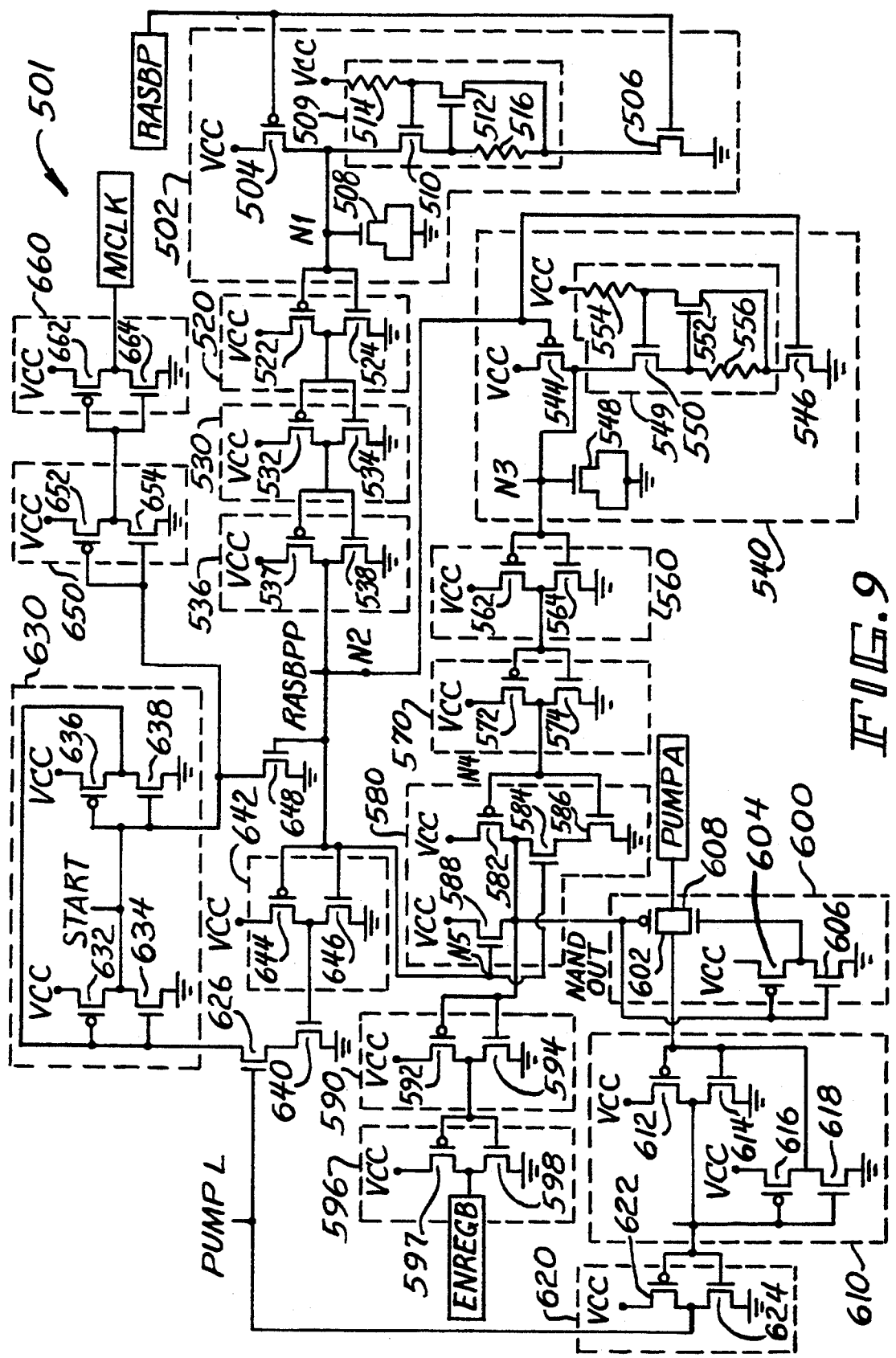
FIG. 9 is a detailed schematic of the active master clock circuit of the active clock circuit for generating a master clock signal.

Turning now to FIG. 9, the active master clock circuit 500 outputs a high MCLK signal when an input RASBP is low and an input PUMPL (i.e. PUMPA previously latched as PUMPL) is high. Generally, a high RASBP drives ENREGB low which enables the active voltage regulator described supra in FIG. 8 to monitor $V_{CCP}$. If $V_{CCP}$ has dropped below a desired value, the active voltage regulator will output an active PUMPA signal (which is input to the active master clock circuit 501 of FIG. 9). When PUMPL is high, MCLK is high to enable a clock circuit to drive the pump circuit. Note that the same clock circuit 445 shown in FIG. 5 is used to generate clock signals CP1-CP5 to drive the active pump circuit 478'. Also, the active pump circuit 478' is identical in structure to the standby pump circuit. However, transistors having different channel widths and lengths are used in the active pump circuit to drive more current to maintain the voltage at $V_{CCP}$. The preferred values of the channel lengths and widths of corresponding transistors employed in the active pump are shown in parenthesis in Appendix A.

In addition, the operation of clock circuit 445 and the active pump circuit 478' is identical to that of the standby circuit. Specifically, clock circuit 445 is responsive to the MCLK signal (similar to MCLKS of the standby master clock circuit 301) to generate clock signals to operate the active pump circuit 478'. The relationship of the MCLK signal to the clock circuit 445 and the active pump circuit 478' has been described in detail in reference to the standby circuit and will not be repeated here. Therefore, only the role of the RASBP signal (indicating that the word lines of a DRAM are being accessed) and other signals in the active master clock circuit 501 to generate a MCLK signal will be discussed in detail.

The detailed operation of active master clock circuit 501 of FIG. 9 is now described. Because RASBP can be either high or low (indicating whether the word lines of a DRAM are being accessed and the active pump should be activated if $V_{CCP}$ drops below a given value), the operation of the circuit will be described separately in both states. When RASBP transitions from high to low (i.e. the word lines will be driven), delay circuit 502 provides a low RASBPP at node N2 after a small delay. RASBPP is a signal which remains low for an additional period of time longer than RASBP, as will be explained infra. When RASBP goes low, a transistor 506 is turned off, decoupling the path from a current source 509 to ground. A low RASBP signal also turns on a transistor 504, which couples a node N1 to $V_{CC}$. Because FET 504 presents little resistance between node N1 and $V_{CC}$, capacitor 508 charges almost immediately and node N1 transitions quickly to $V_{CC}$. This high state at node N1 provides a low RASBPP after passing through a sequence of inverters 520, 530 and 536.

RASBPP signal is input to a number of circuits which control the output MCLK. Generally, the timing of the circuit will be understood in reference to the diagram of FIG. 10. Typically, a constant current source is used to discharge a capacitor to set a delay, although other means of setting the delay could be used. Note generally in FIG. 10 that when RASBP transitions low (i.e. at a time $t_1$) RASBPP transitions low after only a very short delay. However, when RASBP transitions from low to high at a time $t_5$ (discussed in detail infra), RASBPP does not transition high until time $t_6$ after a delay 3 (shown in FIG. 10). This delay is used to ensure that the pumping cycle lasts sufficiently long enough to pump charge and maintain the desired voltage $V_{CCP}$.

In the preferred embodiment, when the RASBPP signal transitions from high to low, transistor 546 of the delay circuit 540 is turned off, decoupling the path from current source 549 to ground. Also, transistor 544 is turned on, coupling the capacitor 548 at node N3 to $V_{CC}$. This capacitor charges quickly, providing a high output at node N3 to inverters 560 and 570.

The output of inverter 570 and signal RASBPP are input to a NAND gate 580 at nodes N4 and N5 respectively. The output of the NAND gate (NAND OUT) is therefore high. This high output of the NAND gate provides a high ENREGB signal after NAND OUT passes through inverters 590 and 596. Therefore, when RASBP is low, active master clock circuit 500 disables the active voltage regulator circuit 200 (shown in FIG. 8) and regulator 200 then no longer monitors $V_{CCP}$ or transmits a high PUMPA signal if $V_{CCP}$ has dropped below a desired value.

The output (NAND OUT) of NAND gate 580 also coupled to a switch 600. This switch generally allows the PUMPA input signal to be latched by latch 610 (as PUMPL). Inverters 590 and 596 are coupled to the output of NAND gate 580 to add a short delay to ensure that switch 600 is disabled before ENREGB goes high to disable the voltage regulator circuit. This ensures that the correct PUMPA signal is latched.

Latch circuit 610 is coupled to an inverter 620, the output of which is a signal PUMPL. When RASBPP is low, switch 600 prevents the PUMPA signal from being transferred to transistor 626. Therefore the value of PUMPL will be determined by the previously latched PUMPA signal (i.e. when RASBPP was previously high). PUMPL is input to a transistor 626. The latch 630 will be allowed to receive PUMPL when transistor 640 is turned on by a low RASBPP signal passed through inverter 642. When RASBPP is low, transistor 648 is turned off and the output of latch 630 is determined by PUMPL.

The output of latch 630 is passed through inverters 650 and 660 to generate the output signal MCLK. If PUMPL is high and RASBPP low, the START signal will be high, which is output through inverters 650 and 660 to provide a high MCLK. If PUMPL is low, the START signal will be low to provide a low MCLK.

Next, the operation of active master clock 501 will be described as RASBP transitions from low to high at time $t_5$. When this occurs, transistor 504 is turned off and transistor 506 is turned on. Therefore, capacitor 508 discharges to ground through constant current source 509. Therefore, a delay is provided (designated as delay 3 in FIG. 10). As stated earlier, this delay is to ensure that the pumping circuit 478' remains in the pumping cycle for a sufficient time to adequately pump $V_{CCP}$ to a desired voltage. As capacitor 508 discharges, the low signal at node N1 is transmitted through inverters 520, 530 and 536. The output of inverter 536 provides a high RASBPP signal at a time $t_6$ after capacitor 508 is discharged (i.e. after delay 3).

The high RASBPP signal is input to delay circuit 540. The high signal turns off transistor 544 and turns on transistor 546, providing a path from capacitor 548 at node N3 to ground by way of current source 549. As the capacitor 548 discharges at node N3 a delay is provided. During this delay, RASBPP is high while the output of inverter 570 is high. Both RASBPP and the output of inverter 570 are input to NAND 580. As a result, the output (NAND OUT) of the NAND gate is low, opening switch 600 and providing a low ENREGB. After transistor 548 discharges, the output of inverter 570 is low, driving the output of the NAND gate (and ENREGB) high.

This delay (designated as delay 4 in FIG. 10) is provided to ensure that ENREGB remains low for a predetermined time for the voltage regulator circuit to compare $V_{CCPREF}$ with $V_{CCREF}$ to determine whether to pump on the next cycle where RASBP goes low. Also, as stated earlier, inverters 590 and 596 are added to the output of the NAND gate 580 to ensure that ENREGB stays low when switch 600 is closed (i.e. when the output NAND OUT of the NAND gate 580 goes low) to ensure that the correct PUMPA signal is latched by latch 610 when RASBP is high.

Figure 10:
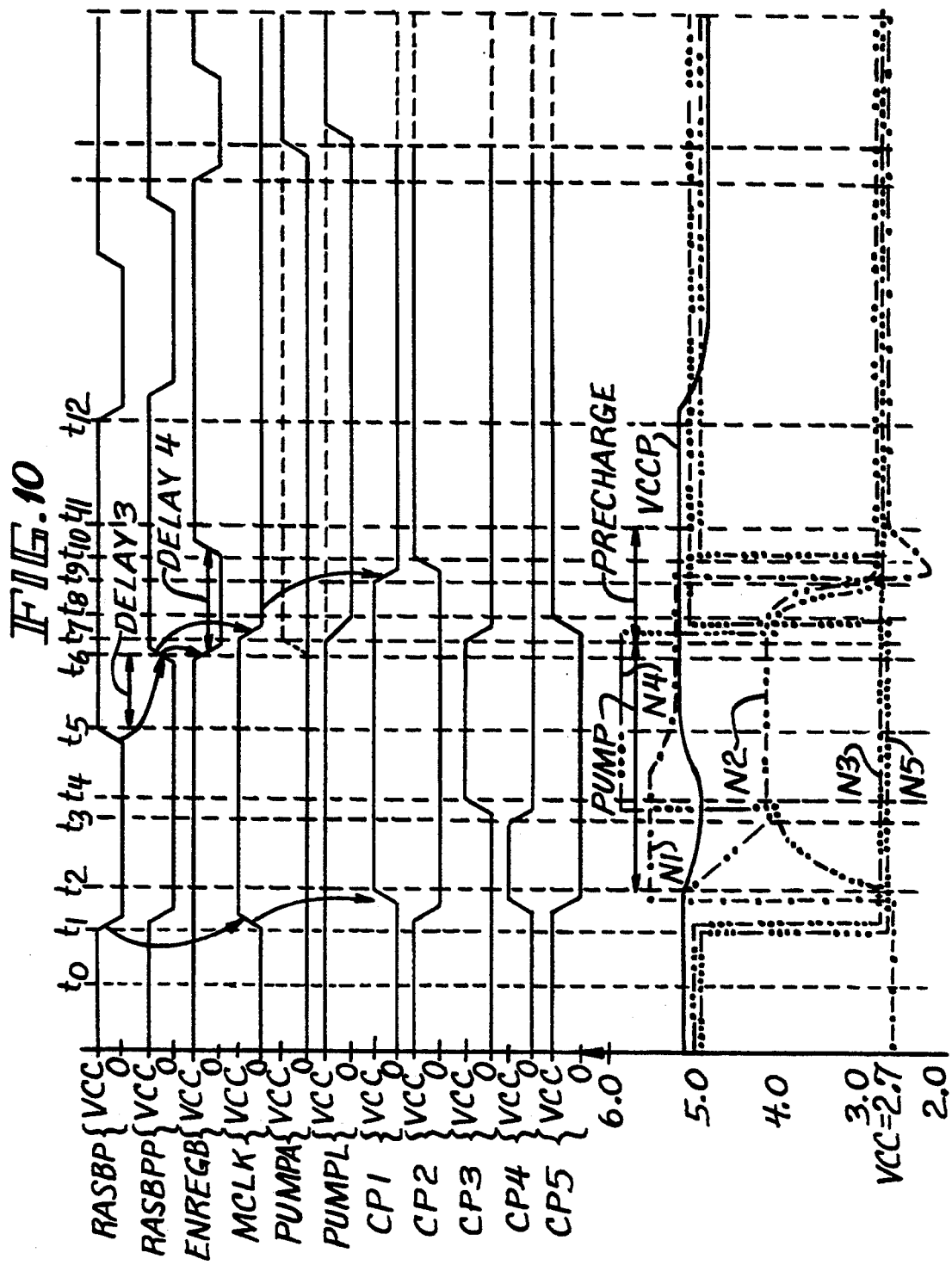
FIG. 10 is a timing diagram for the input and output signals and voltages at various nodes of the active pump circuit.

At the same time that the high RASBPP signal generates the ENREGB signal to determine whether to pump when RASBP goes low, the high RASBPP also generates a low MCLK signal (at time $t_7$ in FIG. 10). Specifically, the latch 630 will be allowed to receive PUMPL only when transistor 640 is turned on by a low RASBPP signal passed through inverter 642. Because RASBPP is high, the output of inverter 642 is low, turning off transistor 640 to ignore the PUMPL signal, providing a self-timing clock which eliminates the requirement for an oscillator. Also, the gate of transistor 648 is high, turning on the transistor to drive the START node low and to generate a low MCLKS signal.

When RASBPP goes low at a later time, switch 600 is closed, and the circuit is ready to pump based upon the previously determined pumping signal (PUMPL) which is input to the gate of transistor 626 to output an appropriate MCLK signal. Therefore, MCLK will drive the active charge pump only when the appropriate conditions exist (i.e. when the RASBP signal indicates that the word lines are activated, drawing charge from $V_{CCP}$, and when PUMPA (latched as PUMPL) has gone high indicating that $V_{CCP}$ has dropped.)

Second Embodiment

Figure 11:
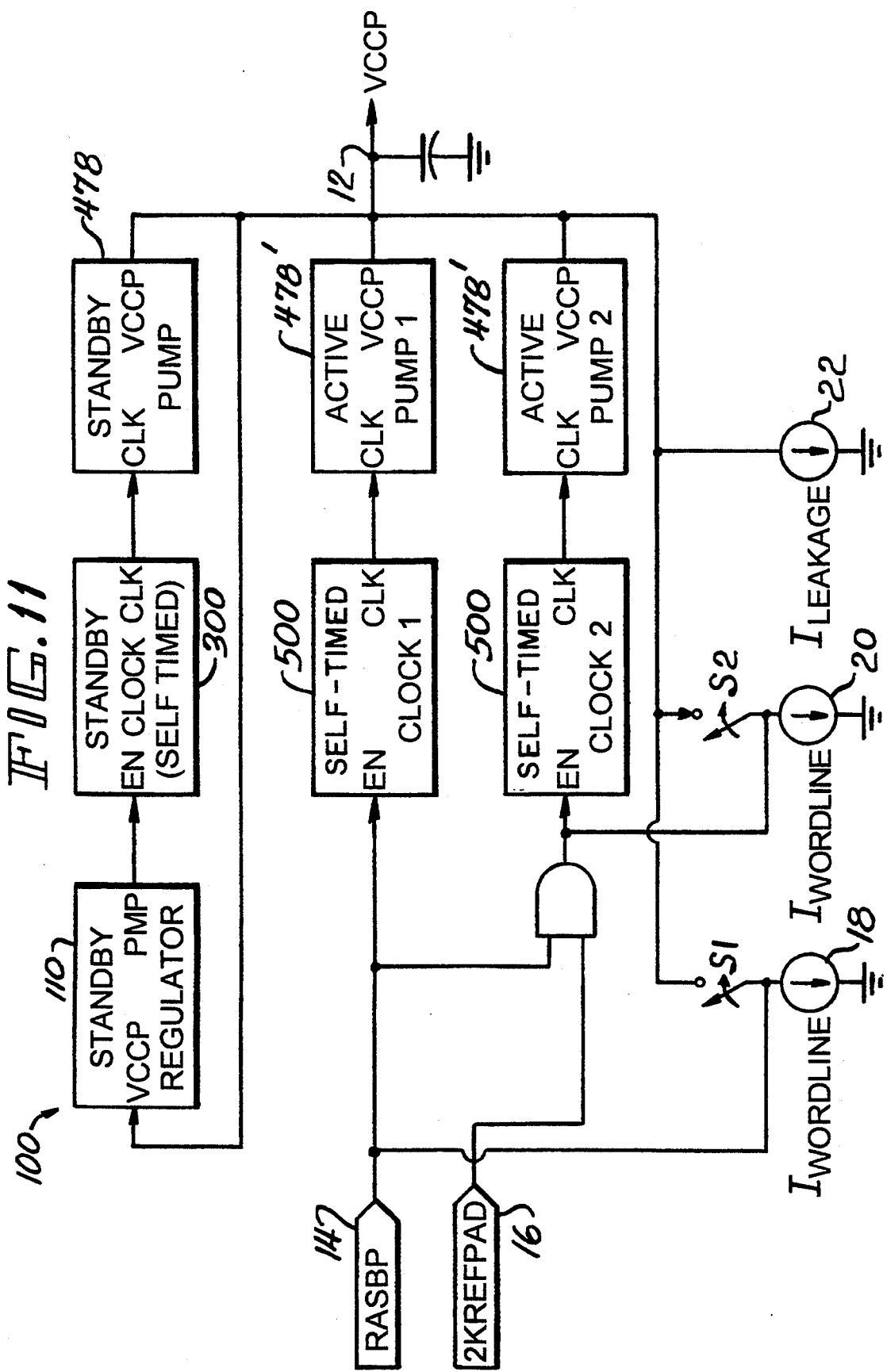
FIG. 11 is a block diagram of a second embodiment of the voltage regulator circuit having no active regulator.
Figure 12:
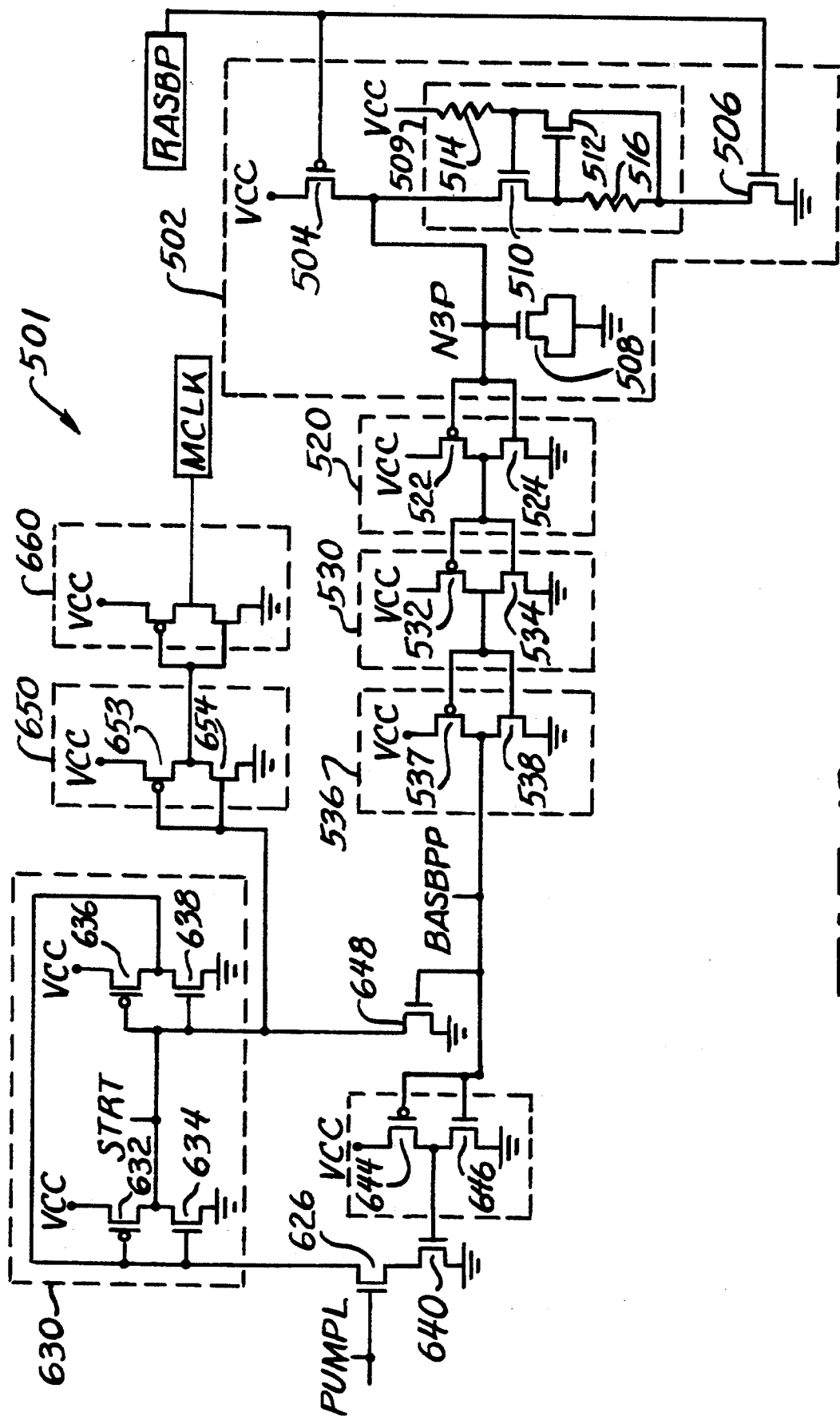
FIG. 12 is a detailed schematic of the master clock circuit for the active pump for the second embodiment.

In a second embodiment, the active regulator circuit can be eliminated as shown in the block diagram of FIG. 11 and the charge pump can pump whenever RASBP goes low. The only difference in this embodiment compared to the first embodiment can be found in the master clock circuit 501. Like circuit components in FIG. 12 are numbered the same as those in FIG. 9. The primary difference in the circuit is that the circuit does not require an active regulator. Rather, a pump signal (i.e. PUMPA or PUMPL) is pinned at $V_{CC}$ and the output MCLK of this master clock circuit is high whenever RASBP goes low. The operation of this circuit is identical to the circuit in FIG. 9, excluding any requirement to generate a PUMPA signal, a PUMPL signal and an ENREGB signal, and therefore, is not described again in detail here.

While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. The invention is intended to be set forth in the depending claims.

| APPENDIX A | | |
|---|---|---|
| TRANSISTOR NUMBER | WIDTH (in μm) | LENGTH (in μm) |
| 113–115 | 2 | 90 |
| 117–118 | 2 | 80 |
| 122–124 | 1 | 15 |
| 126, 128 | 1 | 40 |
| 127 | 2.8 | 64 |
| 130–6 | 1 | 4 |
| 144 | 1 | 4 |
| 146 | 1 | 12 |
| 148 | 1 | 80 |
| 154 | 1 | 40 |
| 156–8 | 1 | 8 |
| 162 | 2 | 1 |
| 164 | 1 | 0.8 |
| 174 | 2 | 1 |
| 176 | 1 | 0.8 |
| 178 | 1 | 100 |
| 180 | 1 | 200 |
| 184 | 2 | 1 |
| 186 | 1 | 0.8 |
| 192 | 4 | 1 |
| 194 | 2 | 0.8 |
| 204 | 10 | 1 |
| 206 | 5 | 1 |
| 208 | 4 | .8 |
| 210 | 35 | 1 |
| 222–4 | 60 | 1.2 |
| 226–8 | 24 | 1.2 |
| 232–4 | 1 | 1.2 |
| 242 | 4 | 1 |
| 244 | 2 | 0.8 |
| 246 | 2 | 1 |
| 248 | 1 | 0.8 |
| 250 | 4 | 1 |
| 252 | 4 | 0.8 |
| 262–8 | 2 | 1 |
| 272 | 4 | 1 |
| 274 | 2 | 0.8 |
| 304 | 4 | 1 |
| 306 | 2 | 0.8 |
| 308 | 2 | 1 |
| 310 | 2 | 0.8 |
| 312–4 | 16 | 0.8 |
| 318 | 4 | 1 |
| 320 | 2 | 0.8 |
| 324 | 8 | 1 |
| 326 | 4 | 0.8 |
| 330 | 8 | 1 |
| 332 | 4 | 0.8 |
| 336 | 20 | 1 |
| 338 | 10 | 0.8 |
| 344 | 10 | 1 |
| 346 | 5 | 0.8 |
| 352 | 10 | 0.8 |
| 354 | 20 | 1 |
| 356 | 20 | 1 |
| 360 | 15 | 0.8 |
| 364 | 45 | 10 |
| 372 | 5 | 1 |
| 374 | 5 | 1 |
| 376 | 2 | 0.8 |
| 378 | 5 | 1 |
| 382 | 2 | 1 |

-continued

| APPENDIX A | | |
|---|---|---|
| TRANSISTOR NUMBER | WIDTH (in μm) | LENGTH (in μm) |
| 384 | 1 | 0.8 |
| 392 | 4 | 1 |
| 394 | 2 | 0.8 |
| 402 | 60 | 10 |
| 404 | 20 | 1 |
| 406 | 15 | 0.8 |
| 408 | 20 | 1 |
| 412 | 10 | 0.8 |
| 422 | 5 | 1 |
| 424 | 4 | 1 |
| 426 | 2 | 0.8 |
| 428 | 5 | 1 |
| 432 | 2 | 1 |
| 434 | 1 | 0.8 |
| 442 | 4 | 1 |
| 444 | 2 | 1 |
| 450 | 8 | 0.8 |
| 479 | 545 (2180) | 25 (25) |
| 480 | 25 (100) | 25 (25) |
| 481 | 35 (140) | 25 (25) |
| 482 | 15 (60) | 25 (25) |
| 483 | 25 (100) | 25 (25) |
| 484 | 60 (60) | 25 (25) |
| 485 | 4 (15) | 25 (25) |
| 486 | 125 (500) | 1.2 (1.2) |
| 487 | 4 (15) | 1.2 (1.2) |
| 488 | 13 (50) | 1.2 (1.2) |
| 481 | 94 (375) | 1.2 (1.2) |
| 490 | 38 (150) | 1.2 (1.2) |
| 491 | 12.5 (50) | 1.2 (1.2) |
| 492 | 4 (15) | 1.2 (1.2) |
| 493 | 4 (15) | 1.2 (1.2) |
| 494 | 4 (7) | 1.2 (1.2) |
| 495 | 4 (7) | 1.2 (1.2) |
| 496 | 4 (4) | 1.2 (1.2) |
| 504 | 20 | 1 |
| 506 | 10 | 0.8 |
| 508 | 30 | 10 |
| 510 | 15 | 0.8 |
| 512 | 20 | 1 |
| 522 | 2 | 1 |
| 524 | 1 | 0.8 |
| 532 | 4 | 1 |
| 534 | 2 | 0.8 |
| 537 | 8 | 1 |
| 538 | 4 | 0.8 |
| 544 | 10 | 1 |
| 546 | 5 | 0.8 |
| 548 | 30 | 5 |
| 550 | 8 | 0.8 |
| 552 | 15 | 1 |
| 562 | 2 | 1 |
| 564 | 1 | 0.8 |
| 572 | 2 | 1 |
| 574 | 1 | 0.8 |
| 582–8 | 2 | 1 |
| 592 | 2 | 1 |
| 594 | 1 | 0.8 |
| 597 | 4 | 1 |
| 598 | 2 | 0.8 |
| 602 | 4 | 1 |
| 604 | 4 | 0.8 |
| 606 | 2 | 1 |
| 608 | 1 | 0.8 |
| 612 | 4 | 1 |
| 614 | 2 | 0.8 |
| 616–8 | 2 | 2 |
| 622 | 4 | 1 |
| 624 | 2 | 0.8 |
| 626 | 16 | 0.8 |
| 632 | 4 | 1 |
| 634 | 2 | 0.8 |
| 636 | 2 | 1 |
| 638 | 2 | 0.8 |
| 640 | 16 | 0.8 |
| 644 | 4 | 1 |
| 646 | 2 | 0.8 |
| 652 | 4 | 1 |

-continued

APPENDIX A

| TRANSISTOR NUMBER | WIDTH (in μm) | LENGTH (in μm) |
|---|---|---|
| 654 | 2 | 0.8 |
| 662 | 4 | 1 |
| 664 | 2 | 0.8 |

We claim:

1. A method for maintaining a high voltage in an integrated circuit memory device receiving a power supply voltage, the method comprising the steps of:
   continuously monitoring said high voltage for a drop in voltage;
   generating first clock signals in response to discovering a drop in the high voltage in said continuously monitoring step;
   operating a first charge pump in response to said first clock signals and applying charge therefrom having the same polarity as said power supply voltage to a capacitive node insulated from a substrate of the integrated circuit;
   intermittently monitoring said high voltage for a drop in voltage, wherein the step of intermittently monitoring said high voltage is performed independently of the step of continuously monitoring said high voltage whenever a word line of said memory device is driven;
   generating second clock signals in response to discovering a drop in the high voltage in said intermittently monitoring step;
   operating a second charge pump in response to said second clock signals and applying therefrom charge having the same polarity as said power supply voltage to said capacitive node;
   at least one of said generating steps including generating a full cycle of clock signals for pumping charge from the corresponding charge pump and for precharging the corresponding charge pump after starting said generating step, regardless of monitoring a decrease in the high voltage.

2. A voltage generator for an integrated circuit having an input for receiving a power supply voltage, the voltage generator providing a high voltage of the same polarity as the power supply voltage for use by circuits formed on or above a substrate of the integrated circuit, the voltage generator comprising the combination of:
   a capacitive output node, insulated from the substrate, to receive the high voltage;
   a first regulator coupled to monitor the high voltage;
   a first clock circuit responsively coupled to said first regulator;
   a first charge pump responsively coupled to the first clock circuit and having an output to provide charge having the same polarity as the power supply voltage to said capacitive output node;
   a second, selectively actuable clock circuit;
   a second charge pump responsively coupled to the second clock circuit and having an output to provide charge having the same polarity as the power supply voltage to said capacitive output node;
   at least one of said clock circuits being a self-timed clock circuit which is configured to produce a full cycle of clock pulses for use by the corresponding charge pump after the clock circuit is activated or enabled, said full cycle being produced by the clock circuit despite any termination of any activation signal or enable signal during the full cycle of clock pulses.

3. The voltage generator of claim 2 wherein the integrated circuit is a dynamic memory;
   wherein said first regulator is a low-power circuit that is configured to be active at all times when the memory is powered;
   wherein the first charge pump is effective to provide the high voltage to the capacitive node when the memory is powering up and when it is in a memory standby mode;
   wherein the second charge pump is effective to provide said high voltage to the capacitive node when the memory is in an active mode;
   wherein the voltage generator further comprises a second regulator coupled to monitor the high voltage, the second regulator including an input for receiving a first enable control signal, the second regulator being responsive thereto;
   wherein the second clock circuit is responsively coupled to said second regulator.

4. The voltage generator of claim 3 wherein both of said clock circuits are selftimed to produce respective full cycles of clock pulses despite any termination of the corresponding activation signals.

5. The voltage generator of claim 3 wherein the voltage generator further comprises:
   a third clock circuit, being a self-timed clock circuit;
   a second input coupled to receive a second enable control signal; and
   a third charge pump responsively coupled to the third clock circuit and having an output coupled to said capacitive output node;
   wherein said third clock circuit is operative only when said second enable control signal is received at said second input;
   wherein the second and third charge pumps are effective to provide said high voltage to the capacitive node only when the memory is in an active mode.

6. The voltage generator of claim 5 wherein the first, second and third clock circuits are each self-timed clock circuits, and wherein each self-timed clock circuit respectively comprises:
   a latch having a first latch input node for setting the latch into a first state and having a second latch input node for resetting the latch into a second state; and
   a latch input circuit connected to the first latch input node, the input circuit being coupled to receive a corresponding activation or enable signal;
   wherein each self-timed clock circuit is configured to inhibit the setting of the latch into the first state again, despite the state of the corresponding activation or enable signal, until a full cycle of clock signals has been substantially generated from a prior setting of the latch into the first state.

7. The voltage generator of claim 6 wherein none of the self-timed clock circuits comprises an oscillator.

8. The voltage generator of claim 6 further comprising a logic circuit providing said second enable control signal,
   said logic circuit being configured receive said first enable control signal and another control signal, and to perform an AND function thereon to produce said second enable control signal.

9. The voltage generator of claim 5, wherein said second and third self-timed clock circuits are responsive to a buffered control signal.

10. The voltage generator of claim 2 wherein the at least one self-timed clock circuit comprises:
a latch having a first latch input for setting the latch into a first state and having a second latch input for resetting the latch into a second state;
a latch input circuit connected to the first latch input, the input circuit being coupled to receive a corresponding activation or enable signal;
the self-timed clock circuit being configured to inhibit the setting of the latch into the first state, despite the state of any corresponding activation signal or enable signal, until a full cycle of clock signals has been generated from a prior setting of the latch into the first state.

11. The voltage generator of claim 10 wherein the at least one self-timed clock circuit further comprises:
a plurality of delay circuits and cascaded gates responsively coupled to said latch;
the self-timed clock circuit being configured so that in response to said latch being set into said first state, the clock circuit generates a first plurality of clock signals for pumping said charge pump over a first self-timed interval;
said plurality of delay circuits and cascaded gates producing a first internal control signal at substantially the end of the first self-timed interval;
said second latch input being coupled to receive said first internal control signal, said latch being reset into said second state in response to said first internal control signal;
said self-timed clock circuit being configured so that in response to said latch being reset into said second state, the clock circuit generates a second plurality of clock signals for precharging said charge pump over a second self-timed interval;
said plurality of delay circuits and cascaded gates producing a second internal control signal at substantially the end of the second self-timed interval;
said latch input circuit being coupled to receive the second internal control signal and being enabled to respond to another activation or enable signal thereby to initiate another full cycle of clock pulses for the charge pump.

12. The voltage generator of claim 11 where both of said clock circuits are self-timed and wherein each self-timed clock circuit respectively includes the combination of claim 11.

13. The voltage generator of claim 2 wherein each of said first and second clock circuits is self-timed, each being configured to produce a respective full cycle of clock pulses for use by the corresponding charge pump after the clock circuit receives a corresponding activation or enable signal, each said full cycle being produced by the clock circuit despite any termination of the activation or enable signal during the full cycle of clock pulses;
wherein neither said first clock circuit nor said second clock circuit is an oscillator.

14. The voltage generator of claim 13 further comprising a second regulator providing a second activation signal, and wherein said second self-timed clock circuit is responsive to the second activation signal.

15. The voltage generator of claim 13 wherein said second self-timed clock circuit is responsive to a buffered control signal.

16. A method of generating a high voltage having the same polarity as a power supply voltage for an integrated circuit, for use by circuits formed on or above a substrate of the integrated circuit, comprising the steps of:
monitoring the high voltage with a first regulator;
selectively operating a first clock circuit, based on the output of said first regulator, to produce first clock signals;
operating a first charge pump based on the first clock signals to pump high voltage of the same polarity as the power supply voltage to a capacitive output node insulated from the substrate;
selectively operating a second clock circuit to produce second clock signals;
operating a second charge pump based on the second clock signals circuit to pump high voltage of the same polarity as the power supply voltage to the capacitive output node;
at least one of said steps of operating a clock circuit including self-timing the clock circuit to produce a full cycle of clock pulses for use by the corresponding charge pump after the clock circuit is activated or enabled, said full cycle being produced by the clock circuit despite any termination of any activation signal or enable signal during the full cycle of clock pulses.

17. The method of 16 wherein the integrated circuit is a dynamic memory having power-up, active and standby modes;
wherein said step of monitoring with a first regulator includes operating a low-power regulator circuit that is active at all times when the memory is powered;
wherein the step of operating the first charge pump provides the high voltage to the capacitive node when the memory is powering up and when it is in the memory standby mode;
wherein the step of operating the second charge pump provides said high voltage to the capacitive node when the memory is in the active mode;
wherein the method of generating a high voltage further comprises selectively applying a first enable control signal to a second regulator and monitoring the high voltage with the second regulator after receiving the first enable control signal;
wherein the step of operating the second clock circuit includes providing an activation signal from the second regulator to the second clock circuit.

18. The method of 17 wherein both of said steps of operating the clock circuits include self-timing the production of respective full cycles of clock pulses despite any termination of the corresponding activation signals.

19. The method of 16 wherein operating the at least one self-timed dock circuit comprises:
selectively setting a latch into a selected one of a first state and a second state, the first state corresponding to the generation of clock signals for pumping charge, the second state corresponding to the generation of clock signals for precharging the corresponding charge pump; and
inhibiting the setting of the latch into the first state, despite the state of any corresponding activation signal or enable signal, until a full cycle of pumping and precharge clock signals has been generated.

20. The method of 19 wherein operating the at least one self-timed clock circuit further comprises:
in response to setting said latch into said first state, generating a first plurality of clock signals for pumping said charge pump over a first self-timed interval;

producing a first internal control signal at the end of the first self-timed interval;

using said first internal control signal to set said latch into said second state;

in response to said latch being set into said second state, generating a second plurality of clock signals for precharging said charge pump over a second self-timed interval;

producing a second internal control signal at the end of the second self-timed interval; and then enabling said latch to initiate another full cycle of clock pulses for the charge pump.

21. The method of claim 16 wherein said steps of producing first and second clock signals each include self-timing the respective interval over which said first clock signals are generated and self-timing the respective interval over which said second clock signals are generated, so that respective full sets of first and second clock pulses are generated for use by the corresponding charge pumps despite any termination of the respective activation or enable signal during the respective full cycle of clock pulses.

22. The method of claim 16 which further comprises the steps of:

selectively activating and self-timing a third clock circuit to produce third clock signals when a second enable control signal is received at a second input;

operating a third charge pump based on the third clock signals to pump high voltage of the same polarity as the power supply voltage to the capacitive output node;

wherein the second and third charge pumps provide said high voltage to the capacitive node only when the memory is in an active mode.

23. The method of claim 22 wherein the first, second and third clock circuits are each self-timed clock circuits, and wherein the operation of each self-timed clock circuit respectively comprises:

setting a logic device into a first state in response to an enable signal or an activation signal;

generating a full cycle of self-timed clock signals for pumping charge from and for precharging the corresponding charge pump in response to said step of setting the logic device; and inhibiting the setting of the logic device into the first state again, despite the state of the corresponding activation or enable signal, until the full cycle of clock signals has been generated.

24. A method of generating a high voltage having the same polarity as a power supply voltage for an integrated circuit, for use by circuits formed on or above a substrate of the integrated circuit, comprising the steps of:

in response to a demand signal, initiating the generation of a full cycle of clock signals over a predetermined interval, said full cycle including a plurality of first clock signals followed by a plurality of second clock signals, said full cycle being generated despite any termination in the demand signal;

using said first clock signals to cause a charge pump to pump charge having the same polarity as the power supply voltage to a capacitive node insulated from the substrate; and using said second clock signals to precharge the charge pump.

25. The method of claim 24 wherein said initiating step includes receiving the demand signal at an input of a self-timed clock circuit, the self-timed circuit generating the first and second clock signals over a self-timed interval;

the method further including preventing the self-timed clock circuit, until substantially the end of the self-timed interval, from a subsequent initiation so that after receipt of a first demand signal, any termination of the first demand signal or initiation of a subsequent demand signal will be disregarded until the full cycle of first clock signals and second clock signals has been generated by the self-timed clock circuit.

26. The method of claim 25 including storing a first state in response to receiving a demand signal and initiating the generation of said first clock signals in conjunction with said storing step.

27. The method of claim 26 further storing a second state and initiating the generation of the second clock signals in conjunction therewith.

28. The method of claim 27 wherein said step of storing a second state occurs substantially at the end of generating the first clock signals.

29. The method of claim 28 wherein the method also includes preventing any restoring of the first state until substantially all of the second clock signals have been generated.

30. The method of claim 24 wherein the initiating step includes, in response to receiving the demand signal, causing a latch in a self-timed clock circuit to enter a first state and producing the first clock signals during a first self-timed interval;

at substantially the end of the first self-timed interval, changing the state of the latch from the first state to a second state and preventing the latch into from reentering the first state despite receipt of another demand signal;

executing a second self-timed interval in the self-timed clock circuit in connection with setting the latch from the first state to the second state;

using a signal generated in the second self-timed interval to enable the self-timed clock circuit to respond to a subsequent demand signal to set the latch in the first state;

whereby a first self-timed interval of pumping charge occurs fully in response to receipt of a first demand signal and then a second self-timed interval of precharging the charge pump occurs fully, despite receipt of any demand signals during the second self-timed interval, following which a subsequent demand signal may set the latch to initiate another pair of first and second self-timed intervals.

31. The method of 24 wherein said initiating step includes setting a latch if a demand signal is received indicative that the capacitive node is to be pumped and if the full cycle of clock signals is not already being generated;

but if the full cycle of clock signals is already being generated, then allowing the full cycle of clock signals to be generated despite the condition of the demand signal.

32. The method of claim 24 wherein said charge pump comprises a first charge pump, and wherein said method further comprises:

operating a second charge pump to pump charge, having the same polarity as the power supply voltage, to said capacitive node.

33. The method of claim 32 wherein said step of operating a second charge pump includes operating a low-current charge pump in response to detecting that the high voltage has decreased below a value.

34. The method of claim 32 further comprising:
detecting when the high voltage at the capacitive node should be pumped and in response to so detecting, applying an initiation signal to a first self-timed clock circuit and operating the first charge pump with clock signals from the first self-timed clock circuit;
selectively initiating a second self-timed circuit and operating the second charge pump with clock signals.

35. The method of claim 34 wherein said step of detecting comprises operating a first voltage regulator coupled to the first self-timed clock circuit during standby periods of the integrated circuit; and
wherein said step of selectively initiating the second self-timed circuit comprises operating a second voltage regulator coupled to the second self-timed clock circuit during periods of high voltage use by the integrated circuit.

36. The method of claim 35 further comprising selectively initiating a third self-timed clock circuit and a third charge pump coupled thereto to pump charge, having the same polarity as the power supply voltage, to said capacitive node.

37. A method of operating a charge pump for providing a high voltage to a capacitive node insulated from a substrate of an integrated circuit comprising the steps of:
obtaining a demand signal indicative of a demand for high voltage and applying the demand signal to an input of a self-timed clock circuit;
operating the self-timed clock circuit in response to said demand signal to generate clock signals;
operating a charge pump connected to the self-timed clock circuit in a pump mode and then a precharge mode, the pump mode pumping charge having the same polarity as the power supply voltage to a capacitive node insulated from the substrate; and thereafter
entering a quiescent state wherein the self-timed clock circuit is ready to respond to a subsequent demand signal,
including continuing said operating steps to completion even if the demand signal terminates before said completion; and
disregarding any demand signals subsequent to the first-received demand signal but before said completion.

38. A high voltage generator for an integrated circuit having an input to receive a power supply voltage comprising:
a first self-timed clock circuit having an input for receiving a demand signal,
the clock circuit being configured so that once initiated, the clock circuit executes a full self-timed cycle even if the demand signal terminates during the self-timed cycle; and
a charge pump responsive to the clock signals for pumping charge having the same polarity as the power supply voltage to a capacitive node insulated from the substrate,
the charge pump being further responsive to the clock signals provided in the full cycle, after said pumping, for preparing for subsequent pumping.

39. The high voltage generator of claim 38 further comprising a second clock circuit and a second charge pump coupled thereto and to said capacitive node.

40. The high voltage generator of claim 39 further comprising a voltage regulator circuit coupled to provide said demand signal to said first clock circuit.

41. The high voltage generator of claim 39 wherein said second clock circuit comprises a second self-timed clock circuit having a second input for receiving a second demand signal,
the second clock circuit being configured so that once initiated, the second clock circuit executes a full self-timed cycle even if the second demand signal terminates during the self-timed cycle; and
wherein the second charge pump is responsive to the clock signals for pumping charge having the same polarity as the power supply voltage to the capacitive node insulated from the substrate,
the second charge pump being further responsive to the clock signals provided in the full cycle of the second clock circuit, after said pumping, for preparing for subsequent pumping.

42. The high voltage generator of claim 41 further comprising a second voltage regulator coupled to provide said second demand signal to said second self-timed clock circuit.

43. The high voltage generator of claim 41 further comprising an input node coupled to receive a control signal, the input node being coupled to said demand signal to said second input.

44. The high voltage generator of claim 41 further comprising a third self-timed clock circuit coupled to provide third clock signals to a third charge pump coupled to pump charge having the same polarity as the power supply voltage to said capacitive node.

45. A high voltage generator for an integrated circuit having an input to receive a power supply voltage comprising:
input means for providing a demand signal indicative that high voltage is in demand;
a clock circuit coupled to receive the demand signal for generating a full set of clock signals including first clock signals for use by a charge pump to pump charge and second clock signals for precharging the charge pump;
the clock circuit being configured to complete said generating of a full set of clock signals despite any termination of the demand signal;
a charge pump responsively coupled to the clock circuit; and
a capacitive output node insulated from a substrate of the integrated circuit;
the charge pump being effective to pump charge having the same polarity as the power supply voltage to said capacitive node in response to said first clock signals;
the charge pump being precharged by the second clock signals;
whereby the generation of a full set of clock signals permits the charge pump to pump and precharge fully in response to receipt of a demand signal despite any change in the demand signal during said full cycle of clock signals.

* * * * *